US010971533B2

(12) United States Patent
Roy

(10) Patent No.: US 10,971,533 B2
(45) Date of Patent: Apr. 6, 2021

(54) VERTICAL TRANSFER GATE WITH CHARGE TRANSFER AND CHARGE STORAGE CAPABILITIES

(71) Applicant: STMicroelectronics (Crolles 2) SAS, Crolles (FR)

(72) Inventor: Francois Roy, Seyssins (FR)

(73) Assignee: STMICROELECTRONICS (CROLLES 2) SAS, Crolles (FR)

( * ) Notice: Subject to any disclaimer, the term of this patent is extended or adjusted under 35 U.S.C. 154(b) by 166 days.

(21) Appl. No.: 15/882,482

(22) Filed: Jan. 29, 2018

(65) Prior Publication Data

US 2019/0237499 A1 Aug. 1, 2019

(51) Int. Cl.
*H01L 27/146* (2006.01)
*H04N 5/374* (2011.01)
*H04N 5/378* (2011.01)
*H04N 5/357* (2011.01)

(52) U.S. Cl.
CPC .... *H01L 27/14614* (2013.01); *H01L 27/1461* (2013.01); *H01L 27/1463* (2013.01); *H01L 27/1464* (2013.01); *H01L 27/14603* (2013.01); *H01L 27/14612* (2013.01); *H01L 27/14621* (2013.01); *H01L 27/14627* (2013.01); *H01L 27/14641* (2013.01); *H01L 27/14645* (2013.01);
(Continued)

(58) Field of Classification Search
CPC ......... H01L 27/14614; H01L 27/14621; H01L 27/14627; H01L 27/1463; H01L 27/1464; H01L 27/1465; H04N 5/374; H04N 5/378
USPC ....................................................... 348/294
See application file for complete search history.

(56) References Cited

U.S. PATENT DOCUMENTS

| 6,184,055 B1 | 3/2001 | Yang et al. |
| 7,067,792 B2 | 6/2006 | Cazaux et al. |
| 8,513,761 B2 | 8/2013 | Roy et al. |

(Continued)

FOREIGN PATENT DOCUMENTS

JP 2005353994 A 12/2005

OTHER PUBLICATIONS

Abid, K., "Gated Lateral Silicon p-i-n Junction Photodiodes" University of Glasgow, College of Science & Engineering, School of Engineering, Jul. 2011, 215 pages.
(Continued)

*Primary Examiner* — Sinh Tran
*Assistant Examiner* — Zhenzhen Wu
(74) *Attorney, Agent, or Firm* — Slater Matsil, LLP

(57) ABSTRACT

In an embodiment, an image sensor includes a semiconductor region, a first doped region disposed over the semiconductor region, a ring shaped well disposed over the first doped region and surrounding parts of the first doped region, a second doped region formed within the ring shaped well and disposed over the first doped region, and a third doped region disposed over the second doped region. The ring shaped well is defined by a conductor surrounded by an insulator. The conductor is connected to a voltage terminal. The third doped region is more heavily doped than the second doped region, which is more heavily doped than the first region, and are all of the same doping type. The first doped region and the second doped region within the ring shaped well, form a potential barrier for controlling transfer of charge carriers from the first doped region to the third doped region.

25 Claims, 16 Drawing Sheets

(52) U.S. Cl.
CPC ............. *H04N 5/374* (2013.01); *H04N 5/378* (2013.01); *H04N 5/3575* (2013.01)

(56) References Cited

U.S. PATENT DOCUMENTS

| | | |
|---|---|---|
| 8,531,567 B2 | 9/2013 | Roy et al. |
| 2006/0289911 A1 | 12/2006 | Lee et al. |
| 2007/0029590 A1 | 2/2007 | Rhodes et al. |
| 2007/0052056 A1 | 3/2007 | Doi et al. |
| 2007/0272958 A1 | 11/2007 | Misaki et al. |
| 2008/0083940 A1 | 4/2008 | Ezaki et al. |
| 2008/0173963 A1 | 7/2008 | Hsu et al. |
| 2008/0224191 A1 | 9/2008 | Ahn et al. |
| 2008/0290382 A1 | 11/2008 | Hirota |
| 2009/0184317 A1 | 7/2009 | Sanfilippo et al. |
| 2010/0019295 A1* | 1/2010 | Henderson ............ H01L 31/107 257/292 |
| 2010/0127314 A1 | 5/2010 | Frach |
| 2010/0133636 A1* | 6/2010 | Richardson ........... H01L 31/107 257/438 |
| 2010/0193845 A1* | 8/2010 | Roy .................... H01L 27/1463 257/228 |
| 2010/0230579 A1 | 9/2010 | Watanabe |
| 2012/0199882 A1* | 8/2012 | Shin ................. H01L 27/14607 257/222 |
| 2013/0193546 A1* | 8/2013 | Webster ............. H01L 27/1443 257/438 |
| 2013/0230956 A1* | 9/2013 | Meiser ............. H01L 29/66477 438/270 |
| 2013/0292847 A1* | 11/2013 | Choi ................. H01L 21/76897 257/774 |
| 2015/0021461 A1* | 1/2015 | Nishihara ......... H01L 27/14609 250/208.1 |
| 2016/0300827 A1* | 10/2016 | Vendt .................. H01L 27/0262 |
| 2017/0222010 A1* | 8/2017 | Weis .................... H01L 29/1095 |
| 2020/0312837 A1* | 10/2020 | Kuo .................... H01L 27/0259 |

OTHER PUBLICATIONS

Mamdy, B. et al., "A low-noise, P-type, vertically-pinned and back-side-illuminated pixel structure for image sensor applications", STMicroelectronics, Institut des Nanotechnologies de Lyon (INL), boulevard of Nov. 11, 1918—69622 Villeurbanne Cedex—France, 4 pages.

Fontanie, Ray, "Innovative Technology Elements for Large and Small Pixel CIS Devices" Technology Analysis Group, Chipworks, Inc., 2013, 4 pages.

Fontaine, Ray, "A Review of the 1.4 μm Pixel Generation", Technology Analysis Group Chipworks Inc., Jan. 2011, 4 pages.

Zhou, YangFan et al., "A low power global shutter pixel with extended FD voltage swing range for large format high speed CMOS image sensor," Science China, Information Sciences, Apr. 2015, vol. 58, 10 pages.

\* cited by examiner

US 10,971,533 B2

VERTICAL TRANSFER GATE WITH CHARGE TRANSFER AND CHARGE STORAGE CAPABILITIES

TECHNICAL FIELD

The present disclosure relates to a backside illumination semiconductor image sensor using double vertical transfer gates.

BACKGROUND

An image sensor, such as those found in digital devices (i.e., digital cameras, tablets, cell phones, etc.) typically use an array of photodetectors to capture and convert light into electrical signals. In a complementary metal oxide semiconductor (CMOS) type of image sensor, the electrical signal from each individual photodetector is amplified and transmitted to an integrated circuit for processing at the same time. Subsequently, the photodetectors are cleared for capturing the next exposure.

In an image sensor that uses backside illumination (BSI), light is exposed on a backside surface of the image sensor. The sensor circuitry that converts the light to a digital signal is arranged on the front side of the image sensor. An image sensor may use a photoelectric effect to absorb and convert light to an electron-hole pair at each of the photodetectors. In an image sensor, that uses photodiodes or photogates, charge carriers (i.e., holes or electrons) are generated and stored in the depletion region of the photodiode or photogates during an integration period in the read cycle of the photodetector. During a charge transfer period in the read cycle of the photodetector, charge carriers around the depletion region are transferred to a connection node and a corresponding digital representation of the level of light exposed at the photodetector is generated.

U.S. Pat. No. 8,513,761 ('761 patent) discloses a backside illumination semiconductor image sensor. FIGS. 1A-1C correspond to FIGS. 1, 4, and 5 of the '761 patent. The '761 patent is incorporated herein by reference.

FIG. 1A schematically illustrates the circuit of a photosensitive cell of an array of photosensitive cells of an image sensor. A charge transfer transistor TR, a precharge device, and a read device are associated with each photosensitive cell of the array. The precharge device is formed of an N-channel MOS transistor RST, interposed between a supply rail Vdd and a read node S. The read device is formed of the series connection of first and second N-channel MOS transistors SF and RD. The drain of transistor SF is connected to supply rail Vdd. The source of transistor RD is connected to an input terminal P of a processing circuit (not shown). The gate of read transistor SF, assembled as a source follower, is connected to read node S.

The photosensitive cell comprises a photodiode D having its anode connected to reference supply rail GND and its cathode connected to node S via charge transfer transistor TR. Generally, the gate control signals of transistors RD, RST, and TR are provided by control circuits, not shown in FIG. 1A, and may be provided to all the photosensitive cells of a same row of the cell array. It should be noted that a photodiode is always associated with a transfer transistor TR, but that there may exist a single precharge device and a single read device for a group of photodiodes, the drains of the transfer transistors of these photodiodes being then interconnected to a same node S.

FIG. 1B is a cross-section view of an embodiment of a cell of an image sensor. This cell is manufactured from a portion of a lightly doped N-type silicon layer or body 11. It is a backside illumination device, that is, layer 11 will initially have formed the upper surface of a thick silicon substrate, possibly the upper silicon layer of a structure of silicon on insulator type (SOI). A heavily doped P-type wall 12 surrounds the cell and separates it from the neighboring cells. A ring-shaped well 13 is formed on the front surface side of the cell and defines a substantially central N-type portion surrounded with an insulated trench (insulator 15) filled with a conductive material 16 connected to a terminal TG. The central portion comprises a lower lightly doped N-type portion 17 and an upper heavily doped N-type portion 18.

Various transistors are formed in well 13, for example, transistors RST and SF of FIG. 1A (transistor RD is not shown). The precharge and read transistors may be common to several neighboring cells, presently to a group of four cells. Various metallization levels are formed on the upper surface, to ensure the connections to the drains, sources, and gates of the various transistors. In particular, an interconnect corresponding to read node S of FIG. 1C is provided between $N^+$ region 18, the drain of precharge transistor RST, and the gate of the follower transistor. Conventionally, once these various layers and connections have been formed, a silicon wafer forming a handle is glued on the upper surface of the metallization stack and the device is thinned down on the rear surface side to have the shown structure.

After this, a thin layer 19 of the second conductivity type is formed over the entire rear surface (this layer may be formed at another manufacturing stage, for example, initially in the case of an SOI substrate). Layer 19 has a function of inversion of the type of majority carriers contained in body 11. This inversion of the concentration of the type of carriers might also be performed by a MOS capacitance at the rear surface provided with an electrode (metallic, semiconductor, or dielectric), transparent in the useful sensor sensitivity spectrum, which creates a free carrier inversion channel (MOS effect).

Finally, the lower surface of each cell is covered with a filter 20 having the desired color for the considered cell, for example, red, green, or blue. Although this is optional in this type of structure, a lens 21 may cover filter 20. As indicated previously, the semiconductor structure may have a thickness about from 3 to 10 micrometers. Further, the lateral extension of each cell may be smaller than one micrometer.

During operation, a phase of photo conversion or integration during which the rear surfaces are illuminated and electrons are stored in body 11 is distinguished from a transfer phase during which the electrons are transferred from body 11 to layer 18 and to read node S.

During the integration phase, the conduction between semiconductor body 11 and heavily doped N-type region 18 is interrupted by an action on control terminal TG coupled to insulated conductive region 16. Indeed, if electrode TG is set to a negative voltage, for example, −1 volt, region 17 is fully depleted from electrons and the passing of the charge carriers is inhibited by the potential barrier thus created between region 17 and body area 11. Thus, region 17 plays the role as the channel region of transistor TR of FIG. 1A and region 18 corresponds to the drain region of this transistor connected to read node S.

FIG. 1C shows another embodiment image sensor cell taught in the '761 patent. In FIG. 1C the same elements are designated with the same reference numerals as in FIG. 1B. The main difference between the cells of FIGS. 1C and 1B is that the insulating wall surrounding the cell is formed of a trench filled with a conductor 24 surrounded with an insulator 23 instead of being a P-type region. Conductor 24 is connected to a terminal Vwall.

SUMMARY

Technical advantages are generally achieved by embodiments of this disclosure, which describe systems and methods for a backside illumination semiconductor image sensor using double vertical transfer gates.

In accordance with an embodiment, an image sensor includes a semiconductor region, a first doped region disposed over the semiconductor region, a ring shaped well disposed over the first doped region and surrounding parts of the first doped region, a second doped region formed within the ring shaped well and disposed over the first doped region, and a third doped region disposed over the second doped region. The ring shaped well is defined by a conductor surrounded by an insulator and the conductor is connected to a voltage terminal. The second doped region is more heavily doped than the first doped region and of the same doping type as the first doped region. The third doped region is more heavily doped than the second doped region and of the same doping type as the first doped region. The first doped region and the second doped region within the ring shaped well, form a potential barrier for controlling transfer of charge carriers from the first doped region to the third doped region.

In accordance with another embodiment, an image sensor has an array of photosensitive cells. Each photosensitive cell includes a semiconductor body, a well disposed in the semiconductor body, a first semiconductor region of a first conductivity type and a first doping level disposed in the well, a second semiconductor region of the first conductivity type and a second doping level disposed in the well beneath the first semiconductor region, a third semiconductor region of the first conductivity type and a third doping level disposed in the well above the first semiconductor region, a switch connected between the conductive material of the isolation structure and a voltage terminal, and a control circuitry connected to a control terminal of the switch. The well is defined by an isolation structure that includes a non-conductive portion and a conductive portion that includes a conductive material surrounded by an insulating material. The non-conductive portion is disposed between the conductive portion and an upper surface of the semiconductor body. The first semiconductor region is surrounded by the conductive portion of the isolation structure. An upper portion of the second semiconductor region is surrounded by the conductive portion of the isolation structure, where the second doping level is less than the first doping level. The third semiconductor region is surrounded by the non-conductive portion of the isolation structure, where the third doping level is greater than the first doping level.

In accordance with yet another embodiment, a method of operating an image sensor includes providing a photodetector that includes a semiconductor body, a well disposed in the semiconductor body, a first semiconductor region of a first conductivity type and a first doping level disposed in the well, a second semiconductor region of the first conductivity type and a second doping level disposed in the well beneath the first semiconductor region, a third semiconductor region of the first conductivity type and a third doping level disposed in the well above the first semiconductor region. The well is defined by an isolation structure that includes a non-conductive portion and a conductive portion that includes a conductive material surrounded by an insulating material. The non-conductive portion is disposed between the conductive portion and an upper surface of the semiconductor body. The first semiconductor region is surrounded by the conductive portion of the isolation structure. An upper portion of the second semiconductor region is surrounded by the conductive portion of the isolation structure, where the second doping level is less than the first doping level. The third semiconductor region is surrounded by the non-conductive portion of the isolation structure, where the third doping level is greater than the first doping level. The method further includes applying bias at the second semiconductor region to set the photodetector under reverse bias, exposing the photodetector to a photon so that an electron-hole pair is generated in the photodetector, applying a voltage at the conductive portion so that the electron or a hole of the electron-hole pair is transferred from the second semiconductor region to the third semiconductor region, and converting a charge of the electron or the hole collected at the third semiconductor region to a read voltage.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1A:
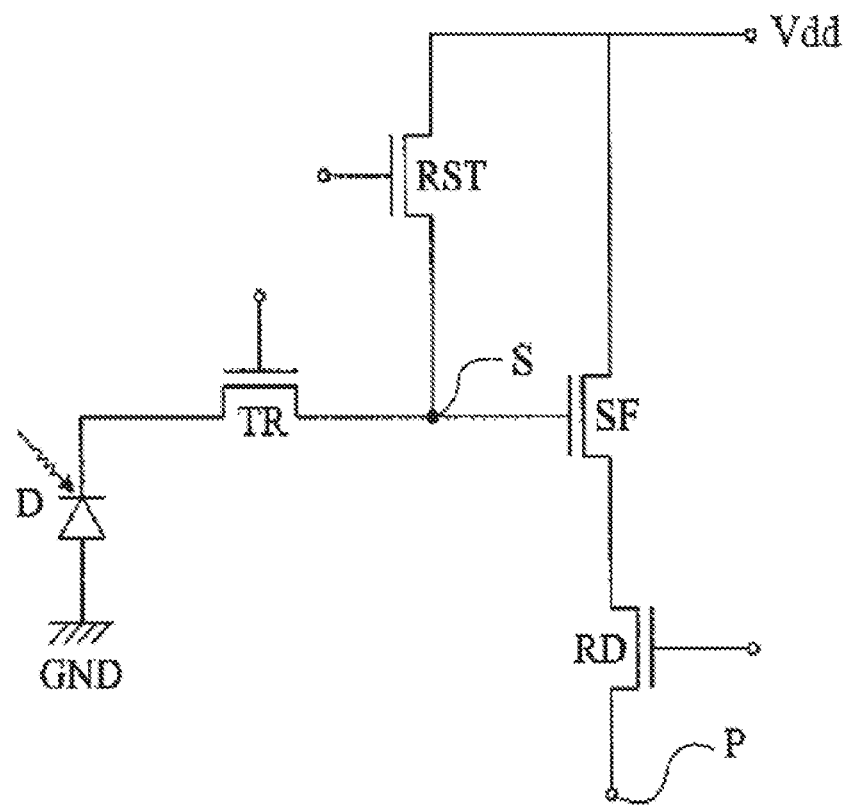
FIGS. 1A-1C, previously described, correspond to FIGS. 1, 4, and 5 of U.S. Pat. No. 8,513,761.
Figure 1B:
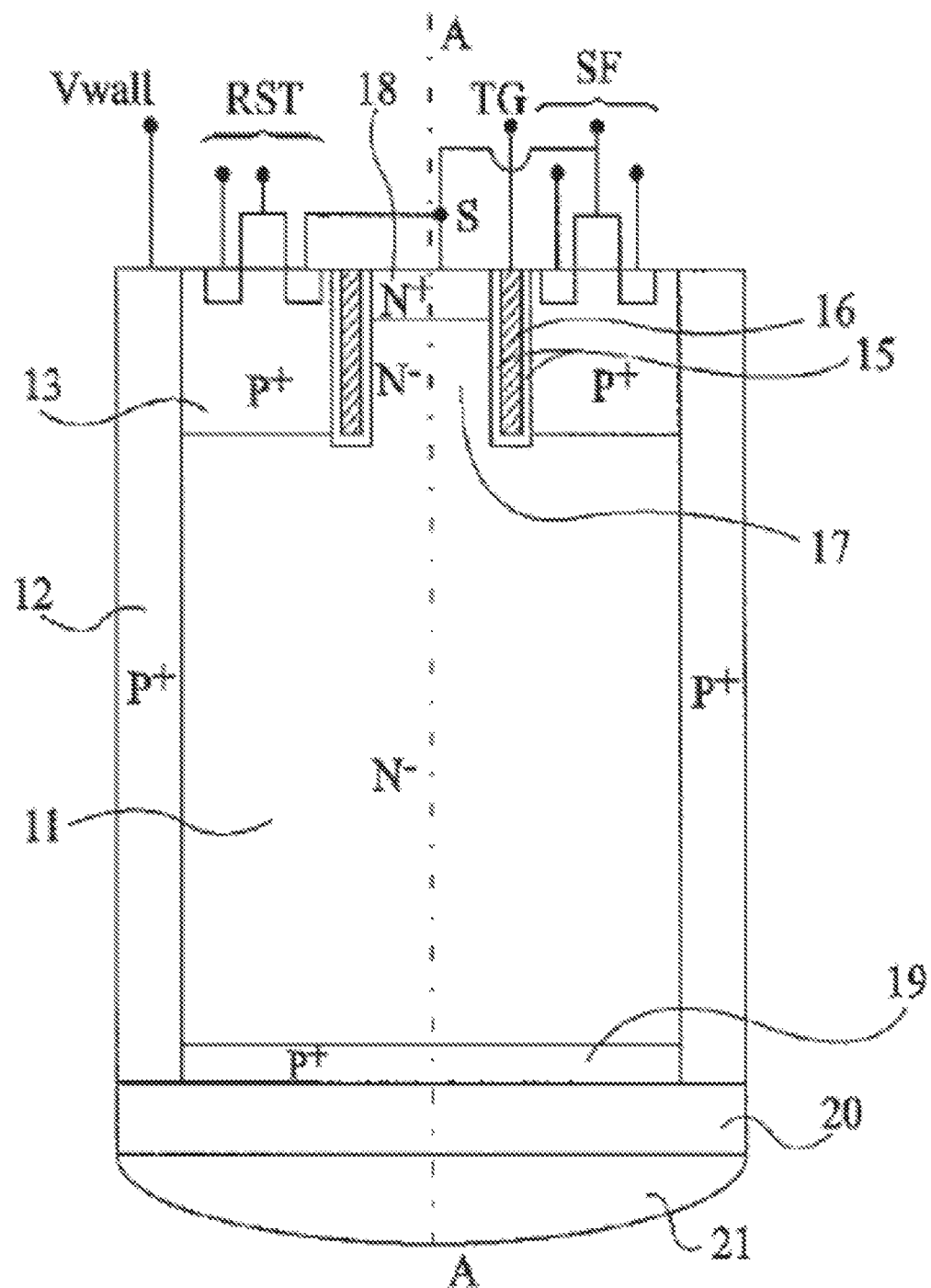
Figure 1C:
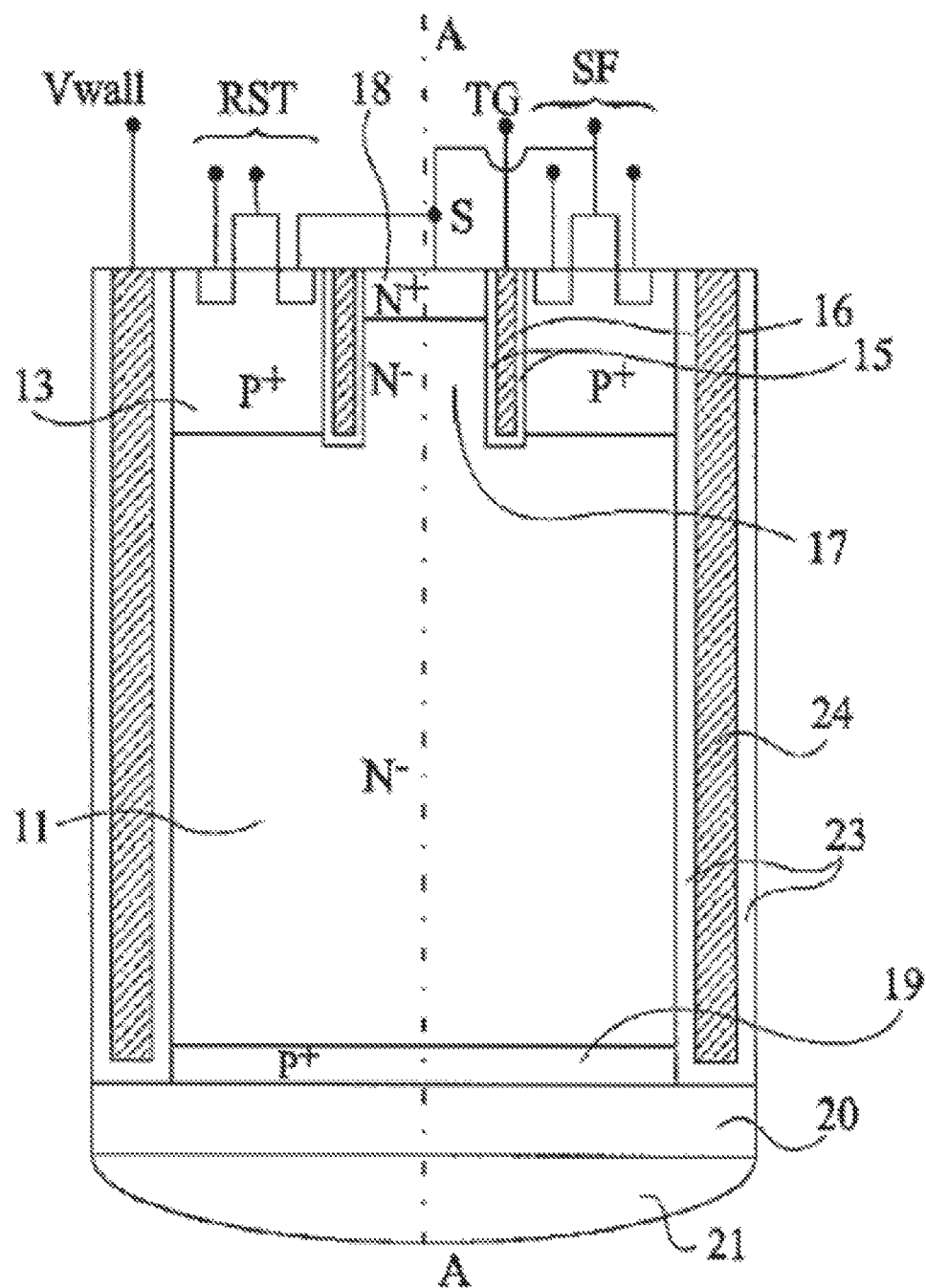

This disclosure provides many applicable inventive concepts that can be embodied in a wide variety of specific contexts. The specific embodiments discussed are merely illustrative of specific configurations and do not limit the scope of the invention.

A typical image sensor includes an array of pixels, which typically comprises one or more photodetectors, arranged in a matrix style configuration. In some image sensors, the photodetector may be a photodiode, which is a semiconductor device that typically has a p-type semiconductor region and an n-type semiconductor region. The boundary between the p-region and the n-region forms the p-n junction of the photodiode. During operation, the photodiode is in reverse bias mode. When the reverse biased photodiode is exposed to photons, electron hole pairs are generated around the p-n junction of the photodiode. The electron hole pairs formed around the p-n junction are swept away to the respective anode and cathode of the photodiode and a photocurrent can be measured. Alternatively, the charge carriers, holes or electrons, are converted into an amplified voltage inside the pixel, which then may be converted to a digital signal for signal processing. As the pixels are arranged in a matrix configuration, the digital signal from each pixel is processed in sequential rows and columns.

Alternatively, a photogate may be used as a substitute for the photodiode as the photodetector. A photogate is a semiconductor device that typically has a p-type semiconductor region, an n-type semiconductor region, and an n-type metal oxide semiconductor (MOS) deep trench region. A p-n junction is formed at the boundary of the p-type semiconductor region and the n-type semiconductor region. During operation, the p-n junction region is in reverse bias mode and the MOS photogate region is in depletion mode. When the reverse biased p-n junction and the MOS photogate region are exposed to photons, electron hole pairs are generated around the p-n junction and the MOS photogate region. Similar to the manner discussed above, with respect to the photodiode, a digital signal is processed as a result of the electron hole pairs generated at the photogate.

In a backside illuminating (BSI) device, incidental light is first exposed at the substrate used to form the photosensitive region and the charge carriers are transferred to the metal wiring of the sensor circuit that is located on the opposing side of the surface exposed to light. This is in contrast with a traditional sensor where the metal wiring is located between the substrate and the incidental light, causing the light to be partially blocked before reaching the photosensitive region of the device.

Embodiments of this disclosure provide an apparatus and method for operating a BSI device having pixel sensors with a gated photodetector and fully depleted metal oxide semiconductor (MOS) transistor having at least double vertical transfer gate regions. The double vertical transfer gate regions advantageously optimize operating voltage, carrier loss, and response time.

In an embodiment, a photodetector is gated through a fully depleted MOS transistor formed by vertical transfer gates. Each vertical transfer gate may be formed by a separate silicon layer having the same doping type but with varying levels of doping. In this embodiment, the layers closer to the backside of the image sensor have a lower doping level than layers nearer the front side of the image sensor. A highly doped region, with the same doping type as the silicon layers, is formed between the vertical transfer gates and the front side of the photodetector.

In another embodiment, a silicon layer in the vertical transfer gate may be formed with a doping profile that varies in depth. In such an embodiment, the doping level of the single silicon layer varies in depth due to more than one doping step, i.e., have a doping profile that varies more than that of a single implantation or diffusion step. The regions near the backside (illuminated side) of the image sensor have a lower doping level than regions near the front side (sensor circuit) of the image sensor.

In these embodiments, a ring shaped well, surrounding the vertical transfer gates, form a gate transfer circuit. Applying a voltage to a conductive element of the ring shaped well creates a potential charge barrier during the integration period of the photodetector.

Schematics of an embodiment photosensitive cell with double vertical transfer gates will be described using FIGS. 2A-2B. In FIG. 3 a simplified schematic cross-sectional view of an embodiment image sensor with double vertical transfer gates will be described. A plan view of an embodiment photosensitive cell with double vertical transfer gates will be described using FIG. 4A. In FIGS. 4B-4C cross-sectional views of an embodiment image sensor with double vertical transfer gates will be described. A doping profile of an embodiment photosensitive cell with double vertical transfer gates will be described in FIG. 5. In FIG. 6 a timing diagram of an embodiment photosensitive cell with double vertical transfer gates will be described. Diagrams of the electrostatic potential of an embodiment photosensitive cell with double vertical transfer gates will be described using FIGS. 7A-7C. In FIGS. 8A-8B plan views of an embodiment image sensor with photosensitive cells having double vertical transfer gates will be described.

Figure 2A:
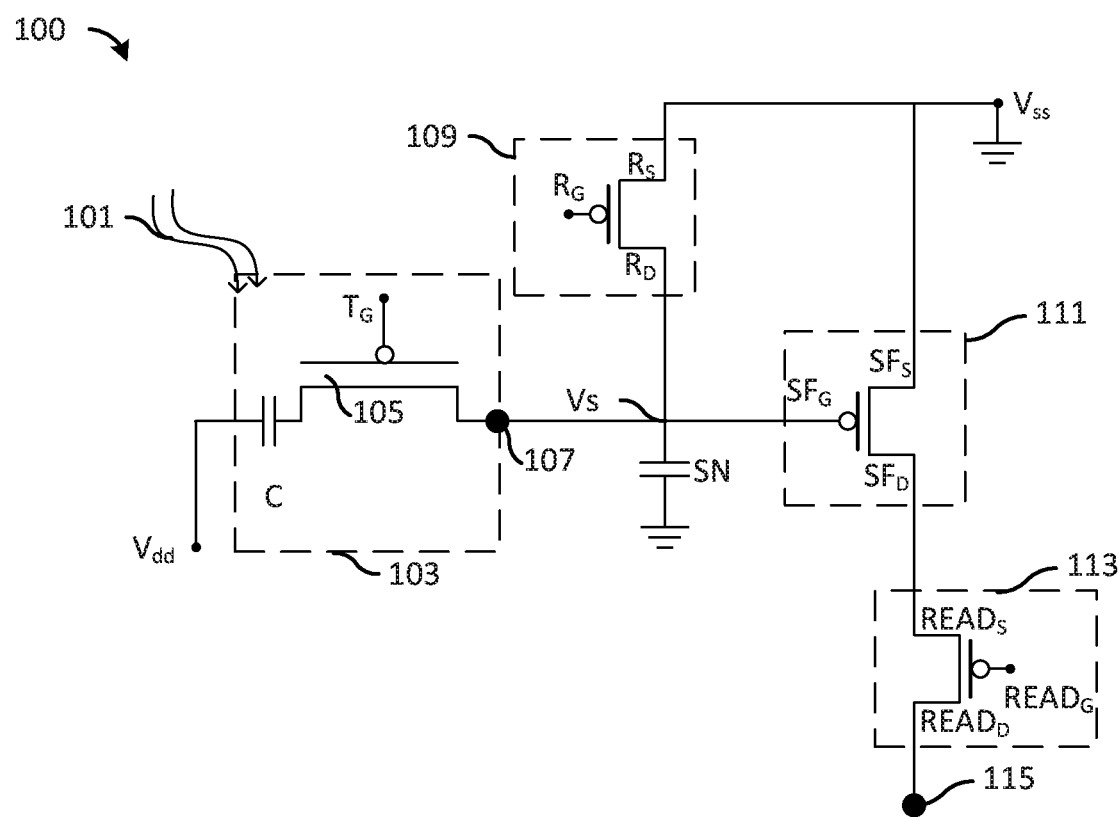
FIGS. 2A-2B are schematics of an embodiment photosensitive cell with double vertical transfer gates.
Figure 3:
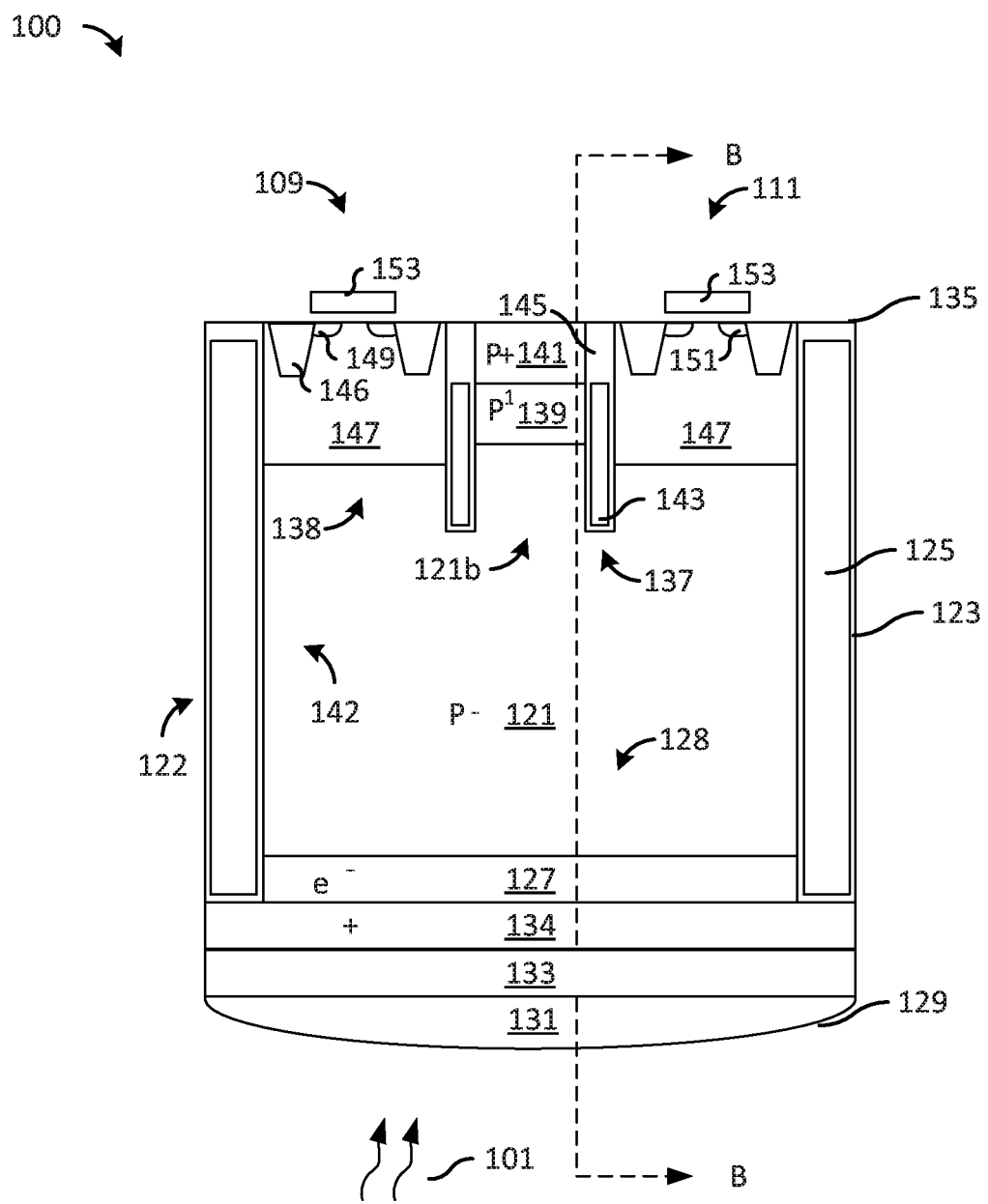
FIG. 3 is a simplified schematic cross-sectional view of an embodiment image sensor with double vertical transfer gates.

FIG. 2A is a schematic of an embodiment photosensitive cell 100. The photosensitive cell 100 comprises a gated photodetector 103, a supply rail Vdd, a sense node storage device SN, and three enhanced mode p-channel metal-oxide semiconductor field-effect transistors (MOSFETs) 109, 111, and 113. The gated photodetector 103, as illustrated, comprises a capacitive body labeled C, a transfer gate 105, and a connection node 107. The sense node SN storage device may or may not be part of the photosensitive cell 100.

In the embodiment photosensitive cell 100, the output of the gated photodetector 103 is coupled to the connection node 107, to the sense node storage device SN, the first current path (i.e., drain) node $R_D$ of a reset MOSFET 109, and the control (i.e., gate) node $SF_G$ of a source follower MOSFET 111.

The second current path (i.e., source) node $R_S$ of the reset MOSFET 109 and the source node $SF_S$ of the source follower MOSFET 111 may be coupled to a shared reference ground supply rail Vss at a near zero voltage value. The reference ground supply rail Vss may be shared with some or all of the photodetectors of an image sensor. The drain node $SF_D$ of the source follower MOSFET 111 may be coupled to the source node $READ_D$ of the read MOSFET 113. The voltage node 115 at the drain node $READ_D$ of the read MOSFET 113 may be sampled and processed by a sensor circuit (not shown).

The gate node of each transistor 109, 111, 113 may be controlled using one or more controllers (not shown). In some embodiments, the one or more controllers may be unique to the photosensitive cell 100 or may be shared with several photodetectors of the image sensor. As an example, a controller may be arranged to control the gate of all the photosensitive cells in the same row or the photosensitive cells in the same column of the image sensor.

Figure 2B:
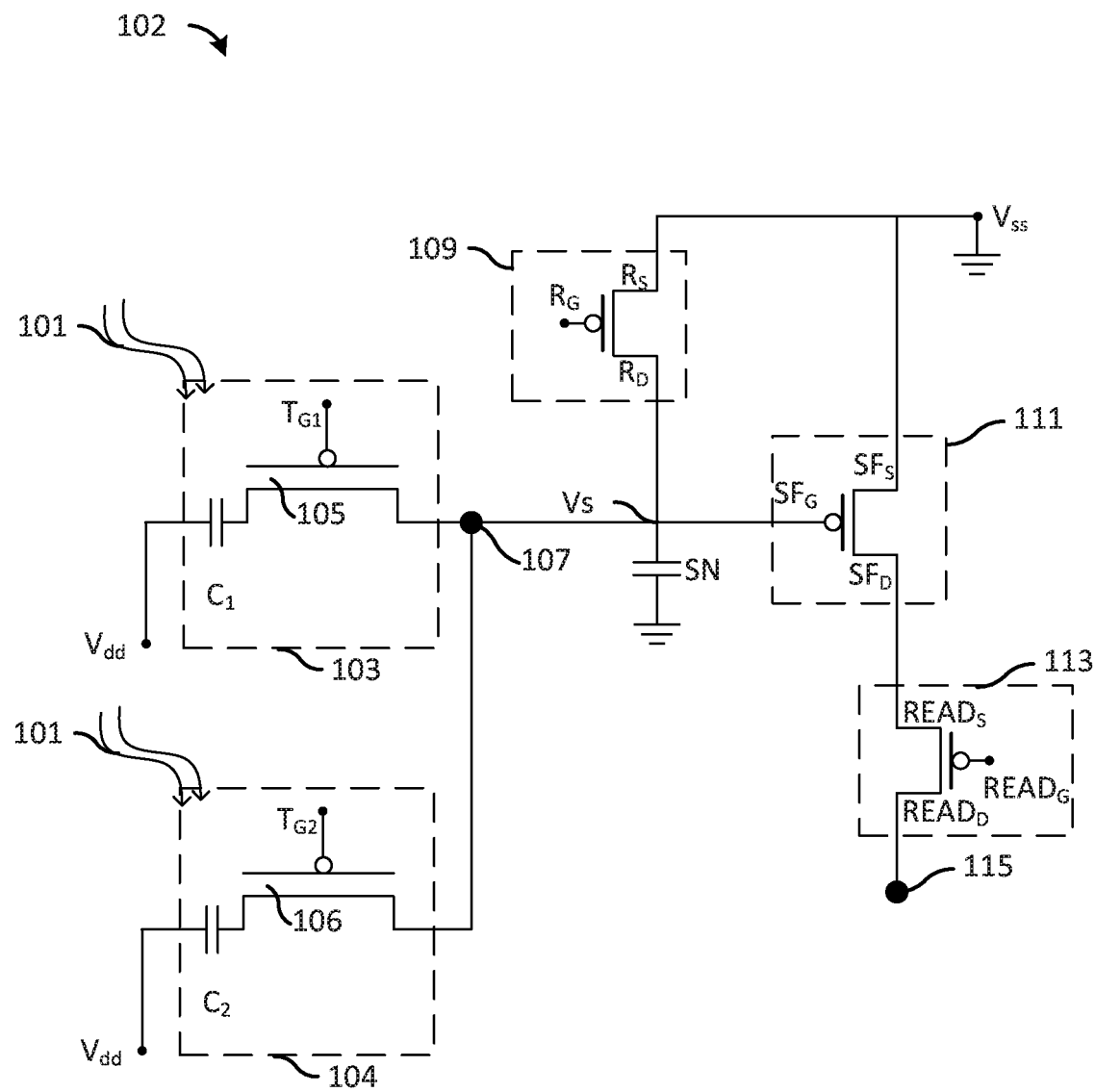

FIG. 2B is an alternative schematic 102 of embodiment photodetectors 103 and 104. In this pixel architecture, the three enhanced mode p-channel MOSFETs 109, 111, and 113 are shared between the two photodetectors 103 and 104. As an example, the photodetector 103 can be arranged in a cell adjacent to the reset MOSFET 109 and the source follower MOSFET 111 and the photodetector 104 may be arranged in a cell adjacent to the read MOSFET 113. In this arrangement, a pair of adjacent photodetectors may share the circuits at the shared connection node 107. The gate $T_{G1}$ and $T_{G2}$ of respective photodetectors 103 and 104 are individually enabled such that the voltage node 115, when sampled and processed, reads the corresponding light at each of the photodetectors 103 and 104 independently of the other photodetector.

FIG. 3 is a simplified schematic cross sectional view of the embodiment photosensitive cell 100 with a gated photodetector having double vertical transfer gates. In FIG. 3, the same elements are designated with the same reference numerals as in FIG. 2A. A typical image sensor uses an array of photosensitive cells to capture an image, although an embodiment with a single photosensitive cell 100 is contemplated.

As illustrated, the body of a photosensitive cell 100 may comprise a lightly doped (i.e., $1 \times 10^{14}$ to $1 \times 10^{16}$ cm$^{-3}$) p-type silicon layer 121. Silicon layer 121 may be fabricated, for example, using silicon boron doped epitaxial process. While described herein with silicon, it is understood that other semiconductors (e.g., silicon germanium, germanium) could be used. It is also understood that the n-doped and p-doped regions could be reversed.

A deep isolation trench 122, comprising a conductor 125 surrounded by an insulator 123, is formed around silicon layer 121 to insulate the photosensitive cell 100 from neighboring cells. The insulator 123 separates the conductor 125 from the lightly doped silicon layer 121. The trench may be of a capacitive deep trench isolation (CDTI) type, which may be biased to collect and store photo-generated charges in the depletion region of the photosensitive cells of the image sensor. In some embodiments, the conductor 125 of the deep isolation trench 122 may be a heavily doped n-type region.

The antireflection dielectric layer 134 is formed on the backside 129 of the photosensitive cell 100. This layer may be advantageous charged positive, to create an e-accumulation surface layer 127 at the backside 129 interface.

Alternatively, the silicon layer 127 may be formed on the backside 129 of the silicon layer 121. The silicon layer 127 is using, for example, an ion implantation process with, for example, arsenic, to form an N+ doped region. The lightly doped p-type silicon layer 121 and the heavily n-doped silicon layer 127 form a photosensitive depletion and charge storage region 128. As noted above, in an alternative embodiment, silicon layer 127 may be heavily doped p-type silicon that forms a photodiode with lightly doped n-type silicon.

A lens 131 and a filter 133 may optionally be formed on the backside 129 of the photosensitive cell 100 to condition light 101 prior to reaching the silicon layer 121. The lens 131 may be used to concentrate incident photons into the photodetector charge carrier collection wells (e.g., charge storage region 128).

The filter 133 may be formed to filter out undesired light (e.g., ultraviolet light) and pass through a desired color, specific to the photosensitive cell 100 of the image sensor. As an example, the filter 133 may only allow red light to pass through to the silicon layer 127 and accordingly neighboring cells may have a filter that only allows blue or green light to pass through.

At the front side 135 of the photosensitive cell 100, a ring shaped well 137 may be formed in the body of the photosensitive cell 100. The ring shaped well 137 surrounds portions of the silicon layer 121 (the silicon layer 121 surrounded by the ring shaped well hereafter referred to as the silicon layer 121b) and the heavily doped p-type regions 139 and 141. The doped region 141 is formed such that it is more heavily doped than the region 139. In turn, the region 139 is formed such that it is more heavily doped than the silicon layer 121. The doped region 141 is nearest to the surface of the front side 135 of the photosensitive cell 100 and is coupled to the connection node 107 of the gated photodetector 103. The region 139 is located between the silicon layer 121b and the doped region 141. The doping levels of the region 139 and the doped region 141 may be formed using an ion implantation process. The doped region 141 creates an improved ohmic contact between region 139 and metal contacts (not shown) on the front side 135 of the photosensitive cell 100.

A conductive material 143 is mostly formed within an isolation layer 145, in the ring shaped well, to gate charges flowing through the gated photodetector 103. As shown in this embodiment, the gate portion 143 does not surround the doped region 141, or at least does not surround a portion of the doped region 141. In other embodiments, the gate portion 143 could extend to the front side surface 135. A voltage applied at the gate portion 143 will create a photodetector with a double vertical transfer gate.

In some embodiments, additional layers may be formed between the silicon layer 121b and the region 139 that are surrounded by the ring shaped well 143. In these embodiments, the layers have the same doping type but the level of doping is increased in a direction from the backside 129 to the front side 135 of the photosensitive cell 100.

In another embodiment, the regions 121, 139 and 141 of the silicon layer have a doping that various along depth. In such an embodiment, the single layer has a doping level that increases as the distance from the backside 129 is increased. The increase may be in steps due to different doping (e.g., implantation) steps. In another embodiment, the region 139 may be a single layer having a doping level that varies (e.g., linearly) along the depth. In these embodiments, the doping level closest to the doped region 141 is greater than the doping level nearer to the silicon layer 121.

Planar p-type MOSFETs 109, 113, and 111 may be formed between the ring shaped well 137 and the deep isolation trench 122 on the front side 135 of the photosensitive cell 100. Shallow trench isolation (STI) 146 may be formed between the planar MOSFETs 109, 113, and 111 and the doped region 141 to separate and isolate the various transistors from each other.

Each p-type MOSFET 109, 113, and 111 has a heavily doped n-type substrate layer formed in the n-well 147, a heavily doped p-type source terminal 149, and a heavily doped p-type drain terminal 151. Additionally, each p-type MOSFET 109, 113, and 111 has a gate terminal 153, which is located between the source terminal 149 and the drain terminal 151. The source follower MOSFET 111 and the reset MOSFET 109 are illustrated as planar enhanced mode p-type MOSFETs A number of contact terminals using various metallization layers may be formed on the front side 135 of the photosensitive cell 100. The contact terminals allow contacts to be formed between the various circuits of the photosensitive cell 100.

In an embodiment, the fabrication of the photosensitive cell 100 may initially comprise fabricating the silicon layer 127 using, for example, an ion implantation process on a silicon starting materiel. Next, the silicon layer 121 may be formed using, for example, a silicon boron epitaxial process. The shallow trench isolation 146 may then be formed in the silicon layer 121 to create a planar MOS stop channel. The deep isolation trench 122 may then be formed to isolate the photosensitive cell 100 from neighboring photosensitive cells. The ring shaped well 137 can then be formed in the silicon layer 121. In some embodiments, the ring shaped well 137 may comprise the insulator 145 and the conductor 143. Subsequently, the n-well 147, the region 139, and the doped region 141 can be formed using, for example, an ion implantation process. Contact and metals may then be formed to make connections between the various transistors and circuits. In accordance with backside illumination technology, the photosensitive circuit wafer will be bonded to a silicon wafer carrier and then back thinned to form a thin silicon membrane (i.e. 2 to 10 μm). The antireflection and passivation layers 134 are formed on the backside surface using, for example, PECVD dielectric layer deposition process. Optionally, the filter 133 and lens 131 may be added to the photosensitive cell 100.

Figure 7A:
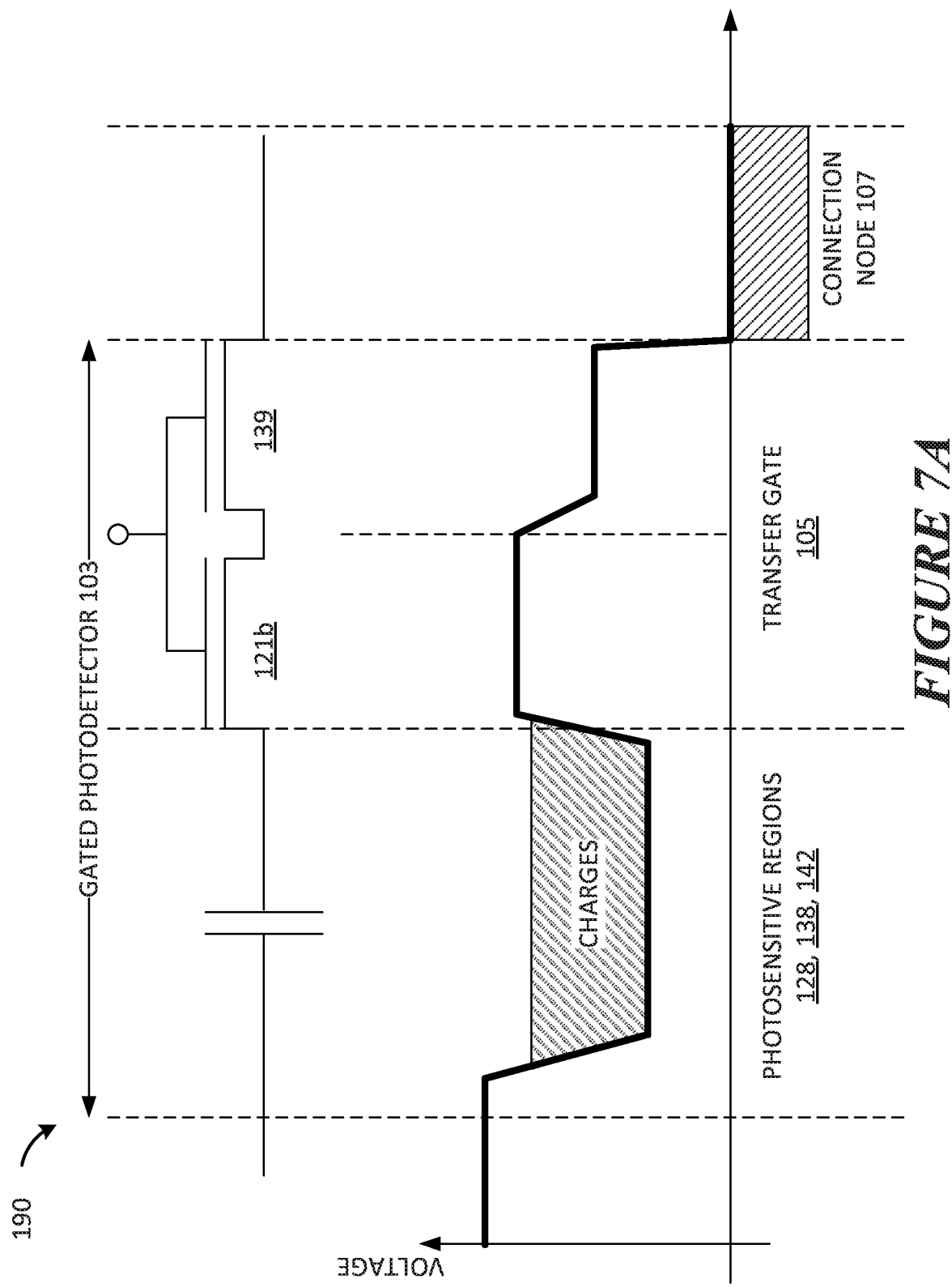
FIGS. 7A-7C are diagrams of the electrostatic potential of an embodiment photosensitive cell with double vertical transfer gates.
Figure 7B:
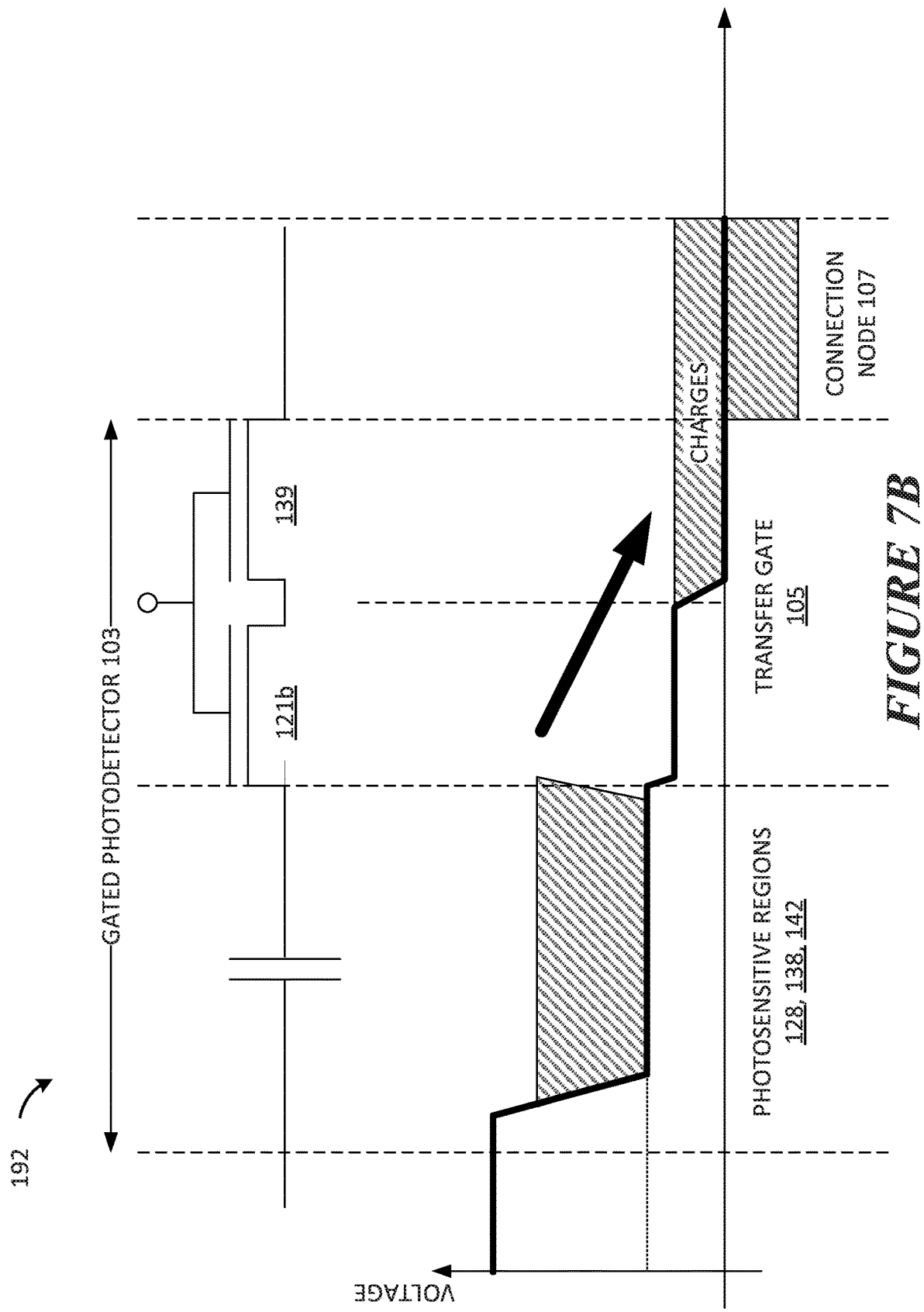
Figure 7C:
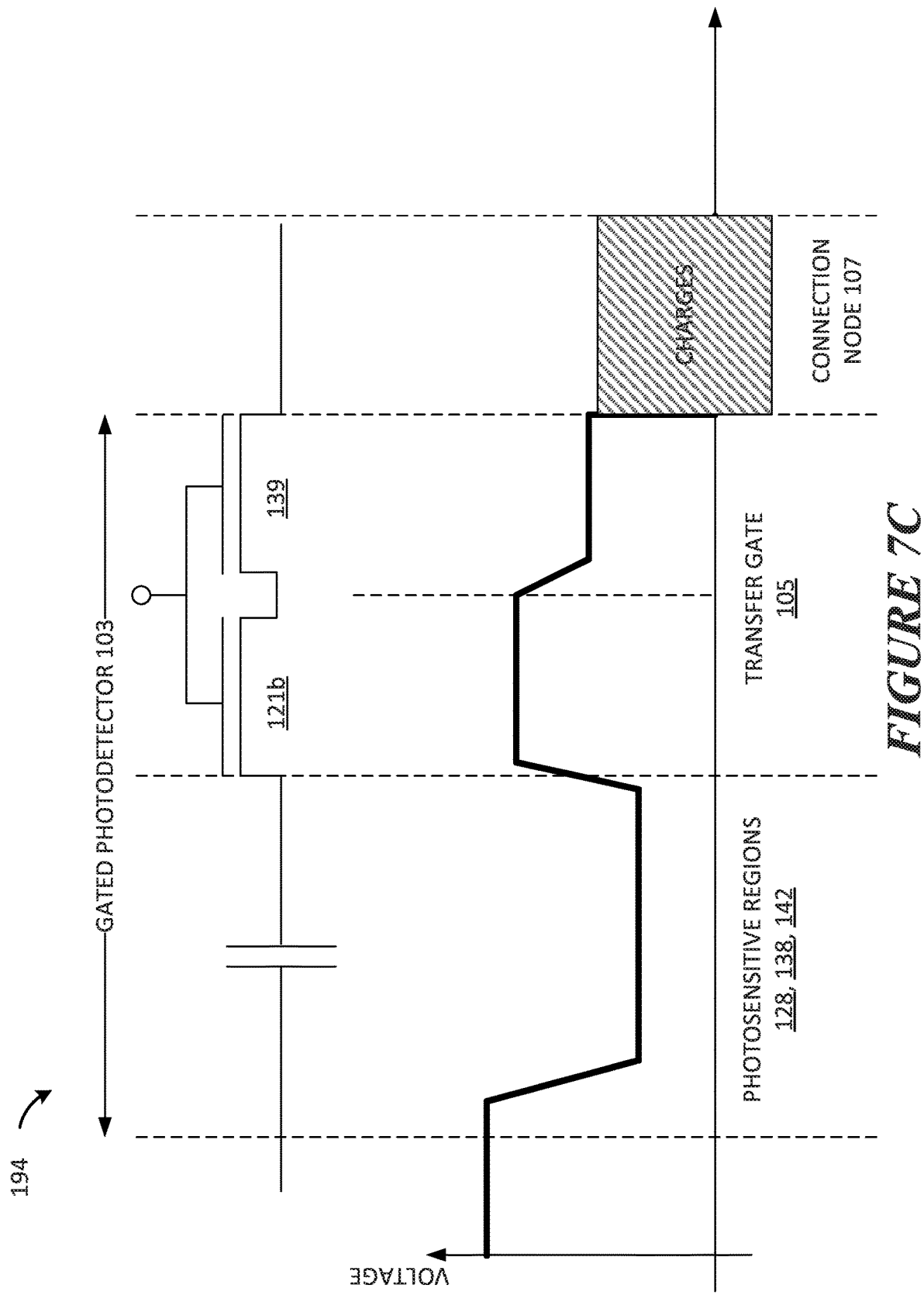
Figure 8A:
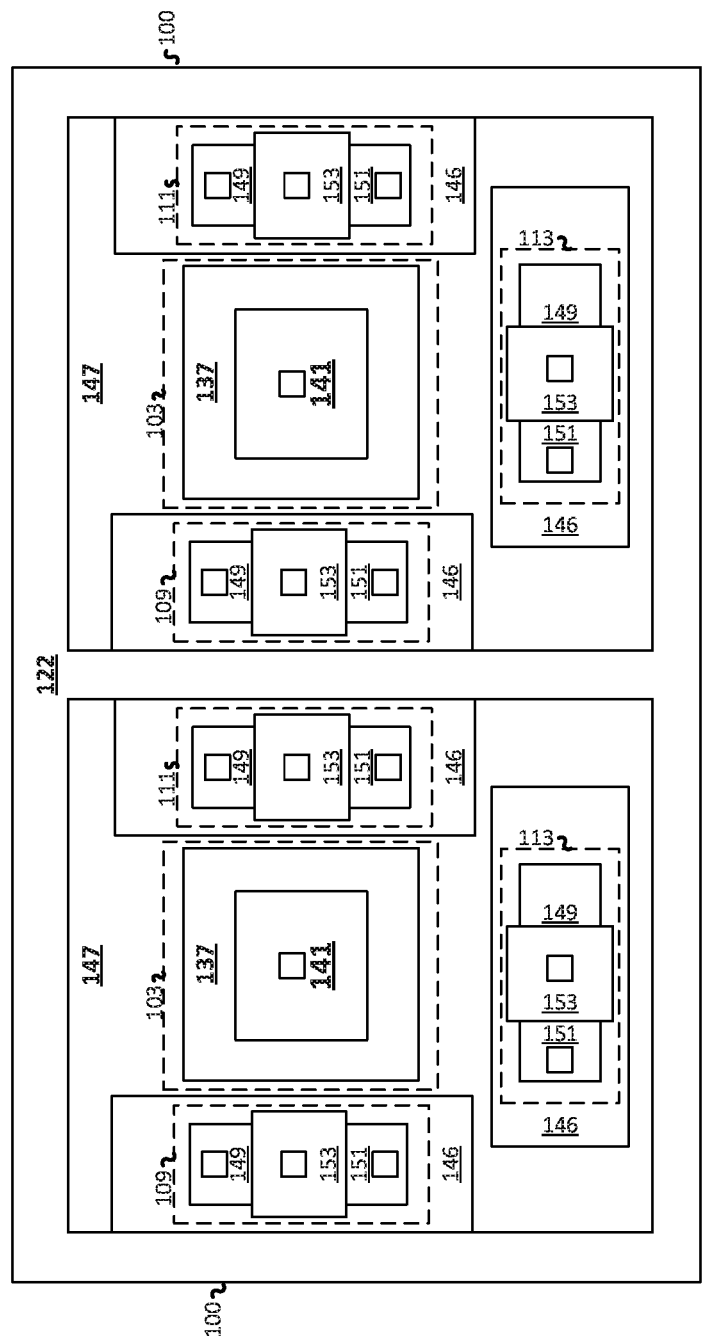
FIGS. 8A-8B are plan views of an embodiment image sensor with photosensitive cells having double vertical transfer gates.
Figure 8B:
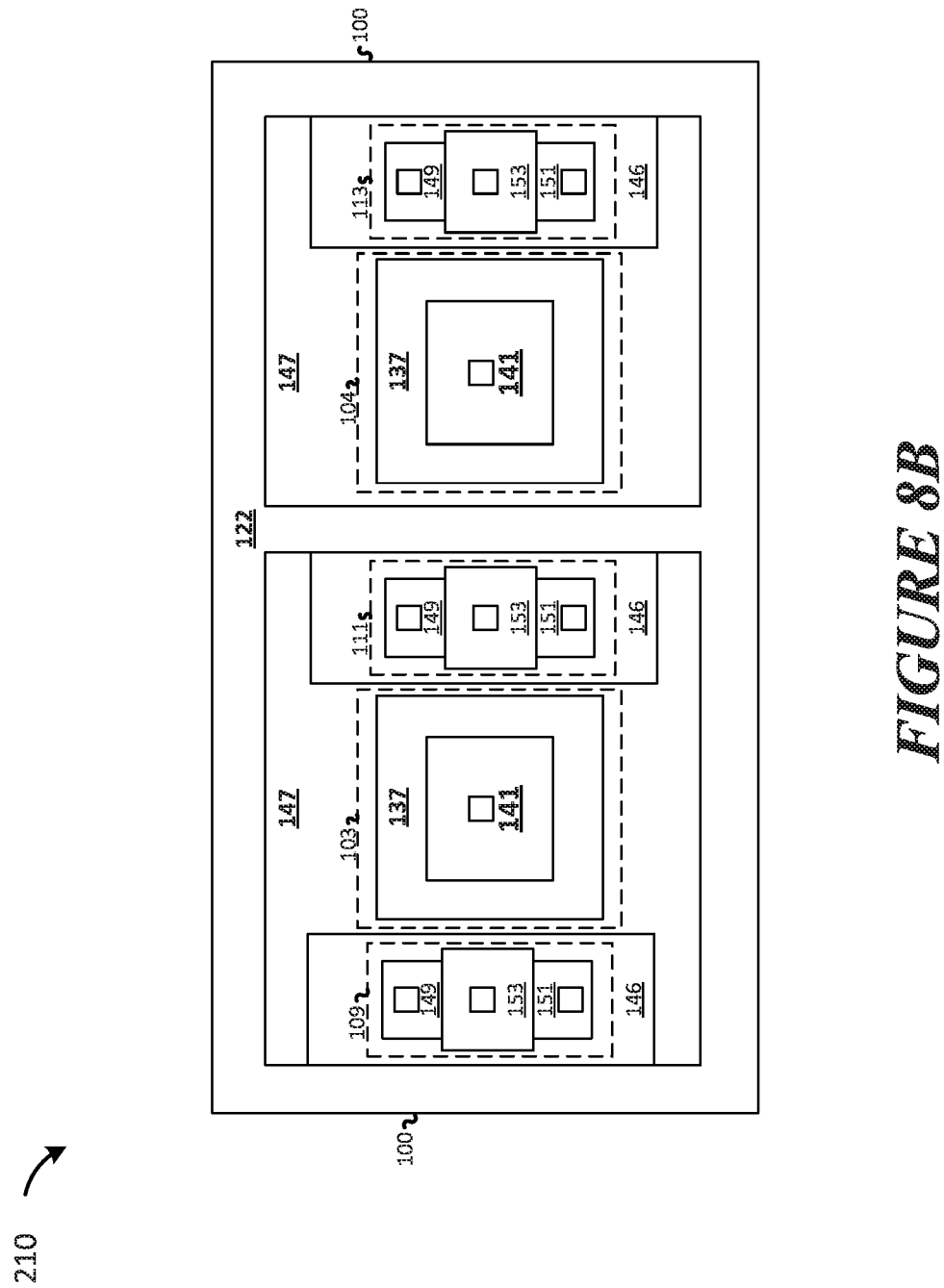

The line B-B of FIG. 3 is used to describe the distribution of charges during an integration phase and during a transfer phase of the photosensitive cell 100 with respect to FIGS. 7A-C.

Figure 4A:
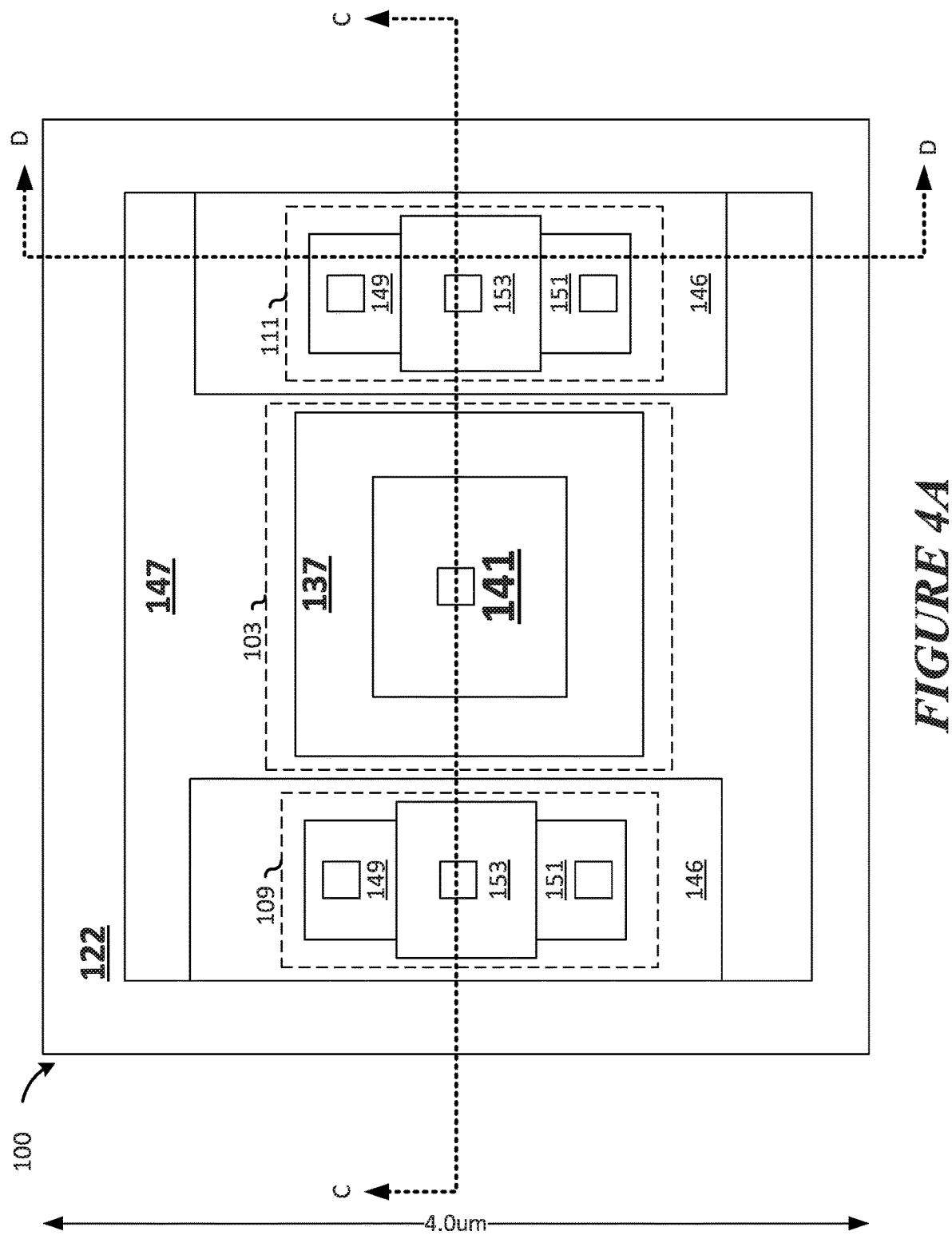
FIG. 4A is a plan view of an embodiment photosensitive cell with double vertical transfer gates.
Figure 4B:
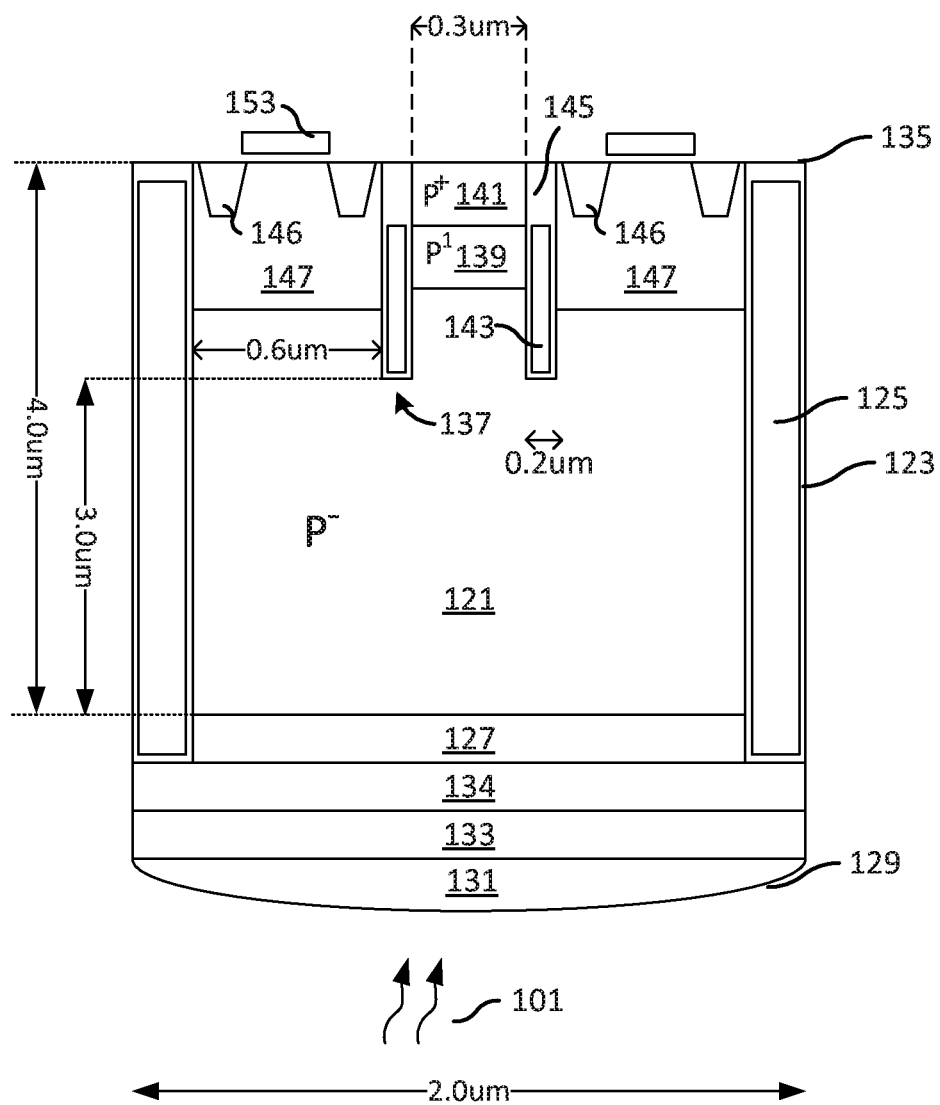
FIGS. 4B-4C are cross-sectional views of an embodiment image sensor with double vertical transfer gates.
Figure 4C:
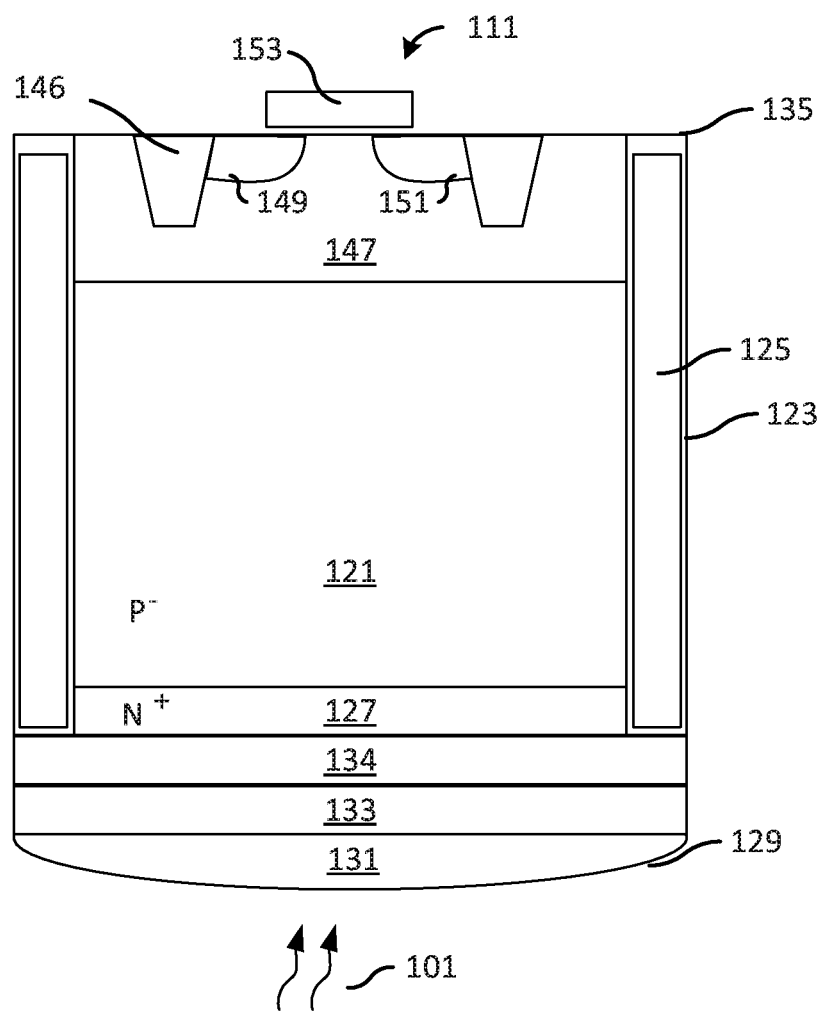

FIGS. 4A-C, collectively FIG. 4, illustrate plan and cross-sectional views of embodiment photosensitive cell 100 with a gated photodetector 103 having double vertical transfer gates. In FIG. 4, the same elements are designated with the same reference numerals as in FIGS. 2-3. In FIG. 4, dimensions are labeled with example values. It is understood that the present invention is not limited to these examples. In fact, it is expected that these dimensions will be smaller over time. The layout of the embodiment of FIG. 4 may allow for less real estate on the die and, as such, more photocells can be formed in the array.

FIG. 4A illustrates a plan view of the embodiment photosensitive cell 100 with a gated photodetector having double vertical transfer gates. In this embodiment, the source follower MOSFET 111 and the reset MOSFET 109 are a pair of planar MOSFETs formed in the n-well 147. Each planar MOSFET 109 and 111 has a corresponding source, gate, and drain terminal. The gated photodetector 103 is formed by the ring shaped well 137 and the photodetector body comprising the doped region 141. The shallow trench isolation 146 is also formed in the n-well 147. The deep isolation trench 122 surrounds the photosensitive cell 100.

FIG. 4B illustrates a cross-sectional view of the embodiment photosensitive cell 100 as shown in FIG. 4A along the line C-C. In the gated photodetector 103, a voltage is applied to the conductive material 143, of the ring shaped well 137, to control the transfer of charge carriers in the gate portion 143.

The silicon layer 121 may typically have a thickness of less than 10 μm and generally be between 3 to 5 μm. The width of the silicon layer 121 may be between several hundred of nanometers and up to 3 μm. Generally by minimizing the width of the silicon layer 121, manufacturers are able to arrange a larger number of photosensitive cells in the same size image sensor or alternatively, reduce the size of the image sensor while maintaining image resolution.

The ring shaped well 137 is formed as a trench with a trench width between 0.1 and 0.2 rpm. The inner dimension of the ring shaped well 137 may be between 0.1 m to 0.4 μm. The depth of the ring shaped well 137 may be from tens of nanometers to 1.5 m. The width of the N-Well 147 is typically from 0.1 to 0.6 μm depending on the size of the photosensitive cell 100 and the size of the ring shaped well 137.

FIG. 4C illustrates a cross-sectional view of the embodiment photosensitive cell 100 as shown in FIG. 4A along the line D-D. In this illustration, the planar source follower MOSFET 111 is shown to be formed in the n-well 147. The n-well 147 extends, along the front side 135, between the deep isolation trench 122 surrounding the photosensitive cell 100.

In the source follower MOSFET 111 shown in FIG. 4C, the source terminal 149 is coupled to the reference ground supply rail Vss. The gate terminal 153 of the source follower MOSFET 111 is coupled to the drain terminal of the reset MOSFET 109. The drain terminal 151 of the source follower MOSFET 111 is coupled to the source terminal of the read MOSFET 113.

The width of the gate terminal 153 is typically less than 500 nm and generally between 250 and 150 nm. The spacing between the drain terminal 151 and the source terminal 149 is typically between 250 and 600 nm.

A cross section comprising the planar reset MOSFET 109 may have similar dimensions and arrangements as those shown in FIG. 4C. In contrast, the gate terminal of the reset MOSFET 109 is controlled by a controller and the drain terminal is coupled to the gate 153 of the source follower MOSFET 111.

Figure 5:
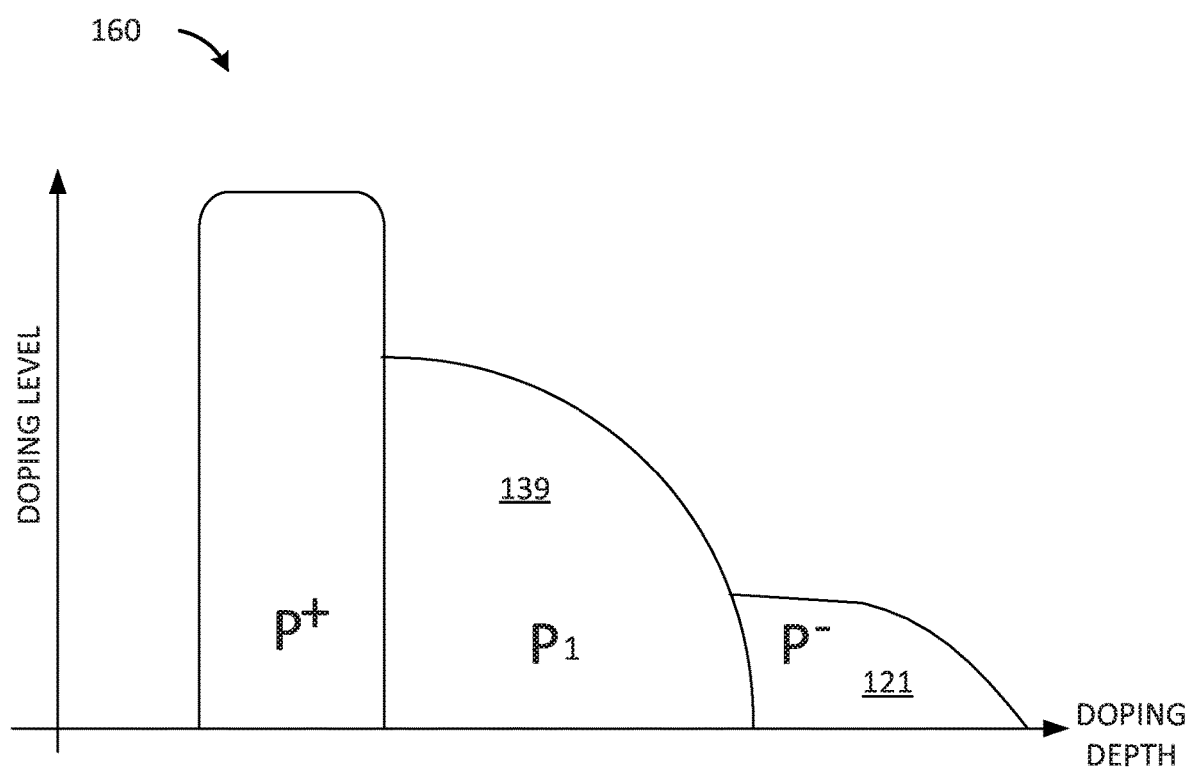
FIG. 5 is a doping profile of an embodiment photosensitive cell with double vertical transfer gates.
Figure 6:
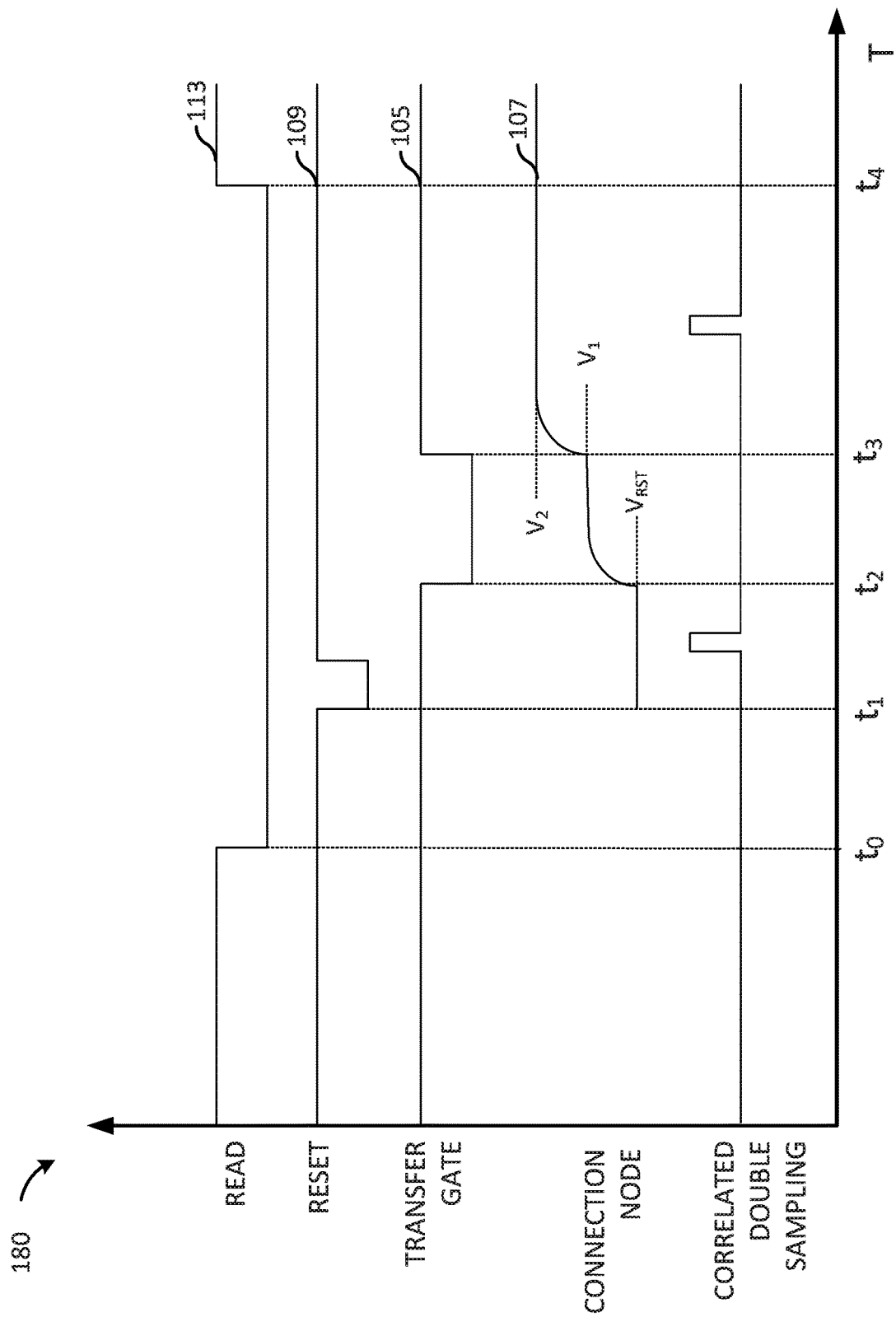
FIG. 6 is a timing diagram of an embodiment photosensitive cell with double vertical transfer gates.

FIG. 5 illustrates one example of a doping profile 16*o* of the silicon layer 121, the region 139, and the doped region 141 as previously described with respect to FIG. 3. A variety of techniques, well known in art, such as ion implantation or diffusion, may be used to introduce the dopant atoms in the semiconductor layers.

As previously described, the silicon layer 121 is lightly doped with p-type materials. In contrast, the region 139 and the doped region 141 are heavily doped with p-type materials. The doping level of the doped region 141 is greater than the region 139 and the doping level of the region 139 is greater than the silicon layer 121. As illustrated, the doping profile of the doped region 141 and the silicon layer 121 are fairly homogeneous. The doping level in the region 139 may have a varying profile, which decreases in doping level until it reaches a doping level near that of the silicon layer 121 at the boundary of the two layers.

The doping levels can be advantageously controlled, during implantation, to optimize the transfer of charges from charge storage region 128 to doped region 141 with respect to the operating voltage, transfer speed, and image quality.

FIG. 6 illustrates a timing diagram 18*o* of the embodiment photosensitive cell 100 as previously described in FIGS. 2, 3, 4A-C. In FIG. 6, the same elements are designated with the same reference numerals as in FIGS. 2-3.

In FIG. 6, the voltage at the control node of the read MOSFET 113, the reset MOSFET 109, and the transfer gate 105 are illustrated in binary form to simplify the discussion. The voltage at the connection node 107, which has the same potential as the control node of the source follower MOSFET 111, the drain node of the reset MOSFET 109, and the doped region 141, is represented in an analog form. In the embodiment photosensitive cell 100, the process of collecting and transferring of charge carriers comprises an integration period, a charge transfer period, and a read period.

As shown in FIG. 6, the control node of the read MOSFET 113 transitions from a high value to a low value at time $t_o$. During the time period between time $t_1$ and time $t_2$, the reset MOSFET 109 is placed in a reset mode and the voltage at the connection node 107 is at a reference voltage (i.e., grounded). It should be noted the control node of the reset MOSFET 109, during the integration period, may be at a high voltage value, however as a result of the anti-blooming structure, the reset MOSFET 109 may be in the ON or OFF state depending on excess charge carriers at the connection node 107.

At time $t_2$, the transfer gate 105 of the photodetector 103 is turned ON and charge carriers are transferred from the charge storage region 128 to the region 139 and the doped region 141. The transfer gate 105 remains in the ON state until time $t_3$, during which the remaining charge carriers at the region 139 are transferred to the doped region 141. At time $t_4$ the readout cycle is complete and the read MOSFET 113 is turned OFF. The voltage at the connection node 107 gradually changes from a value of $V_{RST}$ at time $t_2$ to a value of $V_2$ at time $t_4$. At time $t_2$, when the transfer gate 105 is turned ON, the voltage at the connection node 107 gradually increases to an intermediate voltage value of $V_1$, as the hole charge carriers are gradually transferred from the photosensitive charge storage region 128 through the silicon layer 121b and region 139 to the connection node 107. At time $t_3$, when the transfer gate 105 is turned OFF, the voltage at the connection node 107 increases to the value $V_2$, as the remaining hole carriers in region 139 are transferred to the doped region 141 and the connection node 107.

A first readout sampling is taken immediately after the reset MOSFET 109 has been placed in reset mode (time period between time $t_1$ and time $t_2$). A second readout sampling is taken after time $t_3$ and prior to time $t_4$. The first and second readout samplings are used in a correlated double sampling technique to reduce sources of noise (i.e., thermal noise). However, in some embodiments, the first readout sampling may not be collected.

FIGS. 7A-C illustrate charge diagrams 190, 192, and 194 of the electrostatic potential along a vertical line (i.e., line B-B in FIG. 3) of the embodiment photosensitive cell 100. In FIGS. 7A-C, the same elements are designated with the same reference numerals as in FIGS. 2-3.

FIG. 7A illustrates a charge diagram 190 during the integration period of the photosensitive cell 100. During the integration period, light interacting with the charge storage region 128 generates hole carriers, which are then stored in the region.

As illustrated in FIG. 7A, the transfer gate 105 may act similarly to a depletion mode MOSFET. A potential barrier is created when the voltage at the silicon layer 121b of the double transfer gate is greater than that of the charge storage regions 128. As the potential barrier formed at the silicon layer 121b has a greater potential than that of the charge storage regions 128, the potential barrier prevents charge carriers from transferring to the doped region 141 (see FIG. 3).

FIG. 7B illustrates a charge diagram 192 during the charge transfer period of the photosensitive cell 100 following the integration period. During the charge transfer period, the potential barrier of the transfer gate 105 may be removed. When the voltage potential of the silicon layer 121b and the region 139 are near or less than that of the charge storage regions 128, the potential barrier at the silicon layer 121b and the region 139 is removed and the charge transfer period is initiated.

The potential at the transfer gate 105 may be controlled by setting, for example, the potential of the conductive material 143 to the reference ground supply rail Vss (i.e., 0 volts). A voltage signal may be applied to the conductive material 143 (FIG. 3), for example, through a switch coupled between the conductive material 143 and a voltage terminal. A control circuitry may be coupled to a control terminal of the switch to enable or disable the potential barrier formed within the region 121b. In the transfer period, the switch is enabled and the voltage signal removes the potential barrier formed within the region 121b, enabling the transfer of the charge carriers from the charge storage region 128 to the doped region 141.

In a first step, during the time period between time $t_2$ and time $t_3$ in FIG. 6, charge carriers stored in the charge storage region 128 are transferred to the region 139, the doped region 141, the sense node storage device SN, and any other optional capacitance coupled at the shared connection node 107. In a second step, during the time period between time $t_3$ and $t_4$ in FIG. 6, the remaining charge carriers stored in the region 139 are transferred to the doped region 141, the sense node storage device SN, and any other optional capacitance coupled at the shared connection node 107.

FIG. 7C illustrates a charge diagram 194 during which the charge carriers have been transferred to the connection node 107. Upon transference of the charges, the transfer gate 105 turns OFF, and the second readout sampling is collected. The source follower MOSFET 111, coupled to the connection node 107, acts as a readout transistor and converts the charges into a voltage that is outputted to the column or row bus of the image sensor through the read MOSFET 113. The read MOSFET 113 acts as a switch for row-level selection output of the image sensor. The cycle is repeated for all photosensitive cells 100 of the image sensor and an image is produced from these pixels.

Advantageously, as illustrated in FIG. 3, the vertical transfer gate is formed by the gated portion 143 surrounding the silicon region 121b and the region 139. A first region of the transfer gate 105 comprises the silicon layer 121b and the second region of the transfer gate 105 comprises the region 139. The formation of the two regions with different doping levels advantageously optimizes the operating voltage/power consumption of the photosensitive cell 100 while maintaining or improving image quality in the image sensor.

FIG. 8A illustrates a plan view of an embodiment image sensor 200 comprising photosensitive cells 100. The photosensitive cells 100 can be arranged advantageously such that neighboring cells share similar components. As an example, the deep isolation trench 122 may be common to all sensors or to sensors in a row or a column of the image sensor 200. Although, only 2 photosensitive cells 100 are shown in FIG. 8A and each pair of photosensitive cells 100, it is clear to those skilled in the art that additional photosensitive cells can be arranged in a matrix design.

FIG. 8B illustrates an alternative plan view to FIG. 8A, of an embodiment sensor 210 comprising photodetectors 103 and 104. The plan view in FIG. 8B corresponds to the schematic view of FIG. 2B. In this arrangement, the reset MOSFET 109, source follower MOSFET 111, and the read MOSFET 113 are shared between the photodetectors 103 and 104.

It should also be clear to those skilled in the art that the various features described above with respect to the embodiments of this disclosure and with the state of the art may also be applied to embodiments that detect, accumulate, and transfer electrons. This can be done by inverting the conductivity type of the various elements in the embodiments and adapting the proper voltages. As an example, with respect to FIG. 3, layer 127 may be a p-type region and layers 121, 139, and 141 may be an n-type region.

Example embodiments of the present invention are summarized here. Other embodiments can also be understood from the entirety of the specification and the claims filed herein.

Example 1

An image sensor includes a semiconductor region, a first doped region disposed over the semiconductor region, a ring shaped well disposed over the first doped region and surrounding parts of the first doped region, a second doped region formed within the ring shaped well and disposed over the first doped region, and a third doped region disposed over the second doped region. The ring shaped well is defined by a conductor surrounded by an insulator and the conductor is connected to a voltage terminal. The second doped region is more heavily doped than the first doped region and of the same doping type as the first doped region. The third doped region is more heavily doped than the second doped region and of the same doping type as the first doped region. The first doped region and the second doped region within the ring shaped well, form a potential barrier for controlling transfer of charge carriers from the first doped region to the third doped region.

Example 2

The image sensor of example 1, where the first doped region, the second doped region, and the third doped region are of a first doping type and the semiconductor region is a heavily doped semiconductor region of a second doping type that is opposite to the first doping type.

Example 3

The image sensor of one of the preceding examples, where the image sensor further includes a deep isolation trench laterally surrounding all sides of the semiconductor region and a metal oxide semiconductor field-effect transistor (MOSFET) formed between the ring shaped well and the deep isolation trench, and disposed over the semiconductor region.

Example 4

The image sensor of one of the preceding examples, where the image sensor further includes a lens adjacent a side of the semiconductor region opposite the first doped region and a filter located between the lens and the semiconductor region.

Example 5

The image sensor of example 4, where the filter includes a transparent dielectric layer.

Example 6

The image sensor of one of the preceding examples, where the first doped region includes a photosensitive region and where the photosensitive region is configured to generate charge carriers in response to an exposure to light and to store the charge carriers.

Example 7

The image sensor of example 6, where the image sensor further includes control circuitry configured to supply a voltage to the conductor through the voltage terminal and where the charge carriers are prevented or allowed to flow from the photosensitive region to the third doped region in accordance with the voltage.

Example 8

The image sensor of one of the preceding examples, where the image sensor further includes a reset transistor, a source follower transistor, and a read transistor. A first current path node of the reset transistor is connected to the third doped region and a second current path node of the reset transistor is connected to a second voltage terminal. A control node of the source follower transistor is connected to the first current path node of the reset transistor and a first current path node of the source follower transistor is connected to the second voltage terminal. A first current path node of the read transistor is connected to a second current path node of the source follower transistor.

Example 9

The image sensor of example 8, where the image sensor further includes control circuitry connected to a control node of the reset transistor and to a control node of the read transistor.

Example 10

In accordance with another embodiment, an image sensor has an array of photosensitive cells. Each photosensitive cell includes a semiconductor body, a well disposed in the semiconductor body, a first semiconductor region of a first conductivity type and a first doping level disposed in the well, a second semiconductor region of the first conductivity type and a second doping level disposed in the well beneath the first semiconductor region, a third semiconductor region of the first conductivity type and a third doping level disposed in the well above the first semiconductor region, a switch connected between the conductive material of the isolation structure and a voltage terminal, and a control circuitry connected to a control terminal of the switch. The well is defined by an isolation structure that includes a non-conductive portion and a conductive portion that includes a conductive material surrounded by an insulating material. The non-conductive portion is disposed between the conductive portion and an upper surface of the semiconductor body. The first semiconductor region is surrounded by the conductive portion of the isolation structure. An upper portion of the second semiconductor region is surrounded by the conductive portion of the isolation structure, where the second doping level is less than the first doping level. The third semiconductor region is surrounded by the non-conductive portion of the isolation structure, where the third doping level is greater than the first doping level.

Example 11

The image sensor of example 10, where each photosensitive cell further includes a transistor formed at the upper surface of the semiconductor body outside of the well.

Example 12

The image sensor one of examples 10-11, where each photosensitive cell further includes a deep isolation trench surrounding the semiconductor body, a fourth semiconductor region of a second conductivity type disposed in the semiconductor body beneath the second semiconductor region, a fifth semiconductor region of the second conductivity type disposed at the upper surface of the semiconductor body between the deep isolation trench and the isolation structure, and a transistor formed in the fifth semiconductor region.

Example 13

The image sensor of example 12, where each photosensitive cell further includes a lens adjacent a side of the fourth semiconductor region opposite the second semiconductor region and a filter located between the lens and the fourth semiconductor region, the filter being a transparent dielectric layer.

Example 14

The image sensor of example 12 or 13, where each photosensitive cell further includes a reset transistor and a source follower transistor. The reset transistor is formed in the fifth semiconductor region, where a first current path node of the reset transistor is connected to the third semiconductor region, and where a second current path node of the reset transistor is connected to a second voltage terminal. The source follower transistor is formed in the fifth semiconductor region, where a control node of the source follower transistor is connected to the first current path node of the reset transistor, and where a first current path node of the source follower transistor is connected to the second voltage terminal.

Example 15

The image sensor of example 14, where each photosensitive cell further includes a read transistor formed at the upper surface of the semiconductor body outside of the well, where a first current path node of the read transistor is connected to a second current path node of the source follower transistor.

Example 16

The image sensor of example 15, where the control circuitry is connected to a control node of the reset transistor and to a control node of the read transistor.

Example 17

The image sensor one of examples 10-16, where the third semiconductor region includes a photosensitive region, and where the photosensitive region is configured to generate charge carriers in response to an exposure to light and to store the charge carriers.

Example 18

The image sensor of example 17, where the control circuitry is configured to prevent or alternatively to allow the charge carriers from flowing from the photosensitive region to the first semiconductor region.

Example 19

In accordance with yet another embodiment, a method of operating an image sensor includes providing a photodetector that includes a semiconductor body, a well disposed in the semiconductor body, a first semiconductor region of a first conductivity type and a first doping level disposed in the well, a second semiconductor region of the first conductivity type and a second doping level disposed in the well beneath the first semiconductor region, a third semiconductor region of the first conductivity type and a third doping level disposed in the well above the first semiconductor region. The well is defined by an isolation structure that includes a non-conductive portion and a conductive portion that includes a conductive material surrounded by an insulating material. The non-conductive portion is disposed between the conductive portion and an upper surface of the semiconductor body. The first semiconductor region is surrounded by the conductive portion of the isolation structure. An upper portion of the second semiconductor region is surrounded by the conductive portion of the isolation structure, where the second doping level is less than the first doping level. The third semiconductor region is surrounded by the non-conductive portion of the isolation structure, where the third doping level is greater than the first doping level. The method further includes applying bias at the second semiconductor region to set the photodetector under reverse bias, exposing the photodetector to a photon so that an electron-hole pair is generated in the photodetector, applying a voltage at the conductive portion so that the electron or a hole of the electron-hole pair is transferred from the second semiconductor region to the third semiconductor region, and converting a charge of the electron or the hole collected at the third semiconductor region to a read voltage.

Example 20

The method of example 19, where the photodetector further includes a fourth semiconductor region of a second conductivity type disposed in the semiconductor body beneath the second semiconductor region, and where the electron-hole pair is generated in a photosensitive region of the third semiconductor region.

Example 21

The method of one of examples 19-20, where applying the bias at the second semiconductor region includes applying a first voltage at the second semiconductor region and applying a second voltage at the third semiconductor region.

Example 22

The method of one of examples 19-21, where the photodetector further includes a reset transistor, a source follower transistor, and a read transistor. A first current path node of the reset transistor is connected to the third semiconductor region and a second current path node of the reset transistor is connected to a second voltage terminal. A control node of the source follower transistor is connected to the first current path node of the reset transistor and a first current path node of the source follower transistor is connected to the second voltage terminal. A first current path node of the read transistor is connected to a second current path node of the source follower transistor. The method further includes applying a first voltage to a control terminal of the reset transistor and applying a second voltage to a control terminal of the read transistor to transfer the charge of the electron or the hole collected at the third semiconductor region to the read voltage at a second current path node of the read transistor.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:
1. An image sensor comprising:
    a semiconductor region;

a first doped region disposed over the semiconductor region;

a ring shaped well disposed over the first doped region and surrounding parts of the first doped region, the ring shaped well defined by a first portion and a second portion, the first portion being a conductor surrounded by an insulator, the second portion being an insulator, the conductor coupled to a voltage terminal, the first doped region being within the first portion of the ring shaped well;

a second doped region within the first portion of the ring shaped well and disposed over the first doped region and physically contacting the first doped region, the second doped region being more heavily doped than the first doped region and of the same doping type as the first doped region; and a third doped region disposed over the second doped region and physically contacting the second doped region, the third doped region being more heavily doped than the second doped region and of the same doping type as the first doped region, the first doped region and the second doped region within the ring shaped well forming a potential barrier for controlling transfer of charge carriers from the first doped region to the third doped region, the third doped region being within the second portion of the ring shaped well, wherein the semiconductor region, the first doped region, the second doped region, and the third doped region form a depletion mode transistor.

2. The image sensor of claim 1, wherein the first doped region, the second doped region, and the third doped region are of a first doping type and wherein the semiconductor region is a heavily doped semiconductor region of a second doping type that is opposite to the first doping type.

3. The image sensor of claim 1, further comprising:
a deep isolation trench laterally surrounding all sides of the semiconductor region; and
a metal oxide semiconductor field-effect transistor (MOSFET) between the ring shaped well and the deep isolation trench, and disposed over the semiconductor region.

4. The image sensor of claim 1, further comprising:
a lens adjacent a side of the semiconductor region opposite the first doped region; and
a filter located between the lens and the semiconductor region.

5. The image sensor of claim 4, wherein the filter comprises a transparent dielectric layer.

6. The image sensor of claim 1, wherein the first doped region comprises a photosensitive region, and wherein the photosensitive region is configured to generate charge carriers in response to an exposure to light and to store the charge carriers.

7. The image sensor of claim 6, further comprising control circuitry configured to supply a voltage to the conductor through the voltage terminal, wherein the charge carriers are prevented or allowed to flow from the photosensitive region to the third doped region in accordance with the voltage.

8. The image sensor of claim 1, further comprising:
a reset transistor, wherein a first current path node of the reset transistor is coupled to the third doped region, and wherein a second current path node of the reset transistor is coupled to a second voltage terminal;
a source follower transistor, wherein a control node of the source follower transistor is coupled to the first current path node of the reset transistor, and wherein a first current path node of the source follower transistor is coupled to the second voltage terminal; and
a read transistor, wherein a first current path node of the read transistor is coupled to a second current path node of the source follower transistor.

9. The image sensor of claim 8, further comprising control circuitry coupled to a control node of the reset transistor and to a control node of the read transistor.

10. An image sensor having an array of photosensitive cells, each photosensitive cell comprising:
a semiconductor body;
a well disposed in the semiconductor body, the well defined by an isolation structure that comprises a non-conductive portion and a conductive portion that comprises a conductive material surrounded by an insulating material, the non-conductive portion disposed between the conductive portion and an upper surface of the semiconductor body;
a first semiconductor region of a first conductivity type and a first doping level disposed in the well, the first semiconductor region surrounded by the conductive portion of the isolation structure;
a second semiconductor region of the first conductivity type and a second doping level disposed in the well beneath the first semiconductor region and physically contacting the first semiconductor region, an upper portion of the second semiconductor region surrounded by the conductive portion of the isolation structure, wherein the second doping level is less than the first doping level;
a third semiconductor region of the first conductivity type and a third doping level disposed in the well above the first semiconductor region and physically contacting the first semiconductor region, the third semiconductor region surrounded by the non-conductive portion of the isolation structure, wherein the third doping level is greater than the first doping level, wherein the semiconductor body, the first semiconductor region, the second semiconductor region, and the third semiconductor region form a depletion mode transistor;
a switch coupled between the conductive material of the isolation structure and a voltage terminal; and
control circuitry coupled to a control terminal of the switch.

11. The image sensor of claim 10, wherein each photosensitive cell further comprises a transistor at the upper surface of the semiconductor body outside of the well.

12. The image sensor of claim 10, wherein each photosensitive cell further comprises:
a deep isolation trench surrounding the semiconductor body;
a fourth semiconductor region of a second conductivity type disposed in the semiconductor body beneath the second semiconductor region;
a fifth semiconductor region of the second conductivity type disposed at the upper surface of the semiconductor body between the deep isolation trench and the isolation structure; and
a transistor in the fifth semiconductor region.

13. The image sensor of claim 12, wherein each photosensitive cell further comprises:
a lens adjacent a side of the fourth semiconductor region opposite the second semiconductor region; and
a filter located between the lens and the fourth semiconductor region, the filter being a transparent dielectric layer.

14. The image sensor of claim 12, wherein each photosensitive cell further comprises:
- a reset transistor in the fifth semiconductor region, wherein a first current path node of the reset transistor is coupled to the third semiconductor region, and wherein a second current path node of the reset transistor is coupled to a second voltage terminal; and
- a source follower transistor in the fifth semiconductor region, wherein a control node of the source follower transistor is coupled to the first current path node of the reset transistor, and wherein a first current path node of the source follower transistor is coupled to the second voltage terminal.

15. The image sensor of claim 14, wherein each photosensitive cell further comprises a read transistor at the upper surface of the semiconductor body outside of the well, wherein a first current path node of the read transistor is coupled to a second current path node of the source follower transistor.

16. The image sensor of claim 15, wherein the control circuitry is coupled to a control node of the reset transistor and to a control node of the read transistor.

17. The image sensor of claim 10, wherein the third semiconductor region comprises a photosensitive region, and wherein the photosensitive region is configured to generate charge carriers in response to an exposure to light and to store the charge carriers.

18. The image sensor of claim 17, wherein the control circuitry is configured to prevent or alternatively to allow the charge carriers from flowing from the photosensitive region to the first semiconductor region.

19. A method of operating an image sensor that comprises a photodetector, wherein the photodetector comprises:
- a semiconductor body;
- a well disposed in the semiconductor body, the well defined by a first portion and a second portion, the first portion being an isolation structure that comprises a non-conductive portion and the second portion being a conductive portion that comprises a conductive material surrounded by an insulating material, the non-conductive portion disposed between the conductive portion and an upper surface of the semiconductor body;
- a first semiconductor region of a first conductivity type and a first doping level disposed in the well, the first semiconductor region surrounded by the second portion of the well;
- a second semiconductor region of the first conductivity type and a second doping level disposed in the well beneath the first semiconductor region and physically contacting the first semiconductor region, an upper portion of the second semiconductor region surrounded by the second portion of the well, wherein the second doping level is less than the first doping level; and
- a third semiconductor region of the first conductivity type and a third doping level disposed in the well above the first semiconductor region and physically contacting the first semiconductor region, the third semiconductor region surrounded by the first portion of the well, wherein the third doping level is greater than the first doping levels, wherein the semiconductor body, the first semiconductor region, the second semiconductor region, and the third semiconductor region form a depletion mode transistor; and
wherein the method comprises:
- applying a bias at the second semiconductor region to set the photodetector under reverse bias;
- exposing the photodetector to a photon so that an electron-hole pair is generated in the photodetector;
- applying a voltage at the conductive portion so that an electron or a hole of the electron-hole pair is transferred from the second semiconductor region to the third semiconductor region; and
- converting a charge of the electron or the hole collected at the third semiconductor region to a read voltage.

20. The method of claim 19, wherein the photodetector further comprises a fourth semiconductor region of a second conductivity type disposed in the semiconductor body beneath the second semiconductor region, and wherein the electron-hole pair is generated in a photosensitive region of the third semiconductor region.

21. The method of claim 20, wherein applying the bias at the second semiconductor region comprises applying a first voltage at the second semiconductor region and applying a second voltage at the third semiconductor region.

22. The method of claim 19, wherein the photodetector further comprises:
- a reset transistor, wherein a first current path node of the reset transistor is coupled to the third semiconductor region, and wherein a second current path node of the reset transistor is coupled to a second voltage terminal; and
- a source follower transistor, wherein a control node of the source follower transistor is coupled to the first current path node of the reset transistor, and wherein a first current path node of the source follower transistor is coupled to the second voltage terminal; and
- a read transistor, wherein a first current path node of the read transistor is coupled to a second current path node of the source follower transistor,
wherein the method further comprises applying a first voltage to a control terminal of the reset transistor and applying a second voltage to a control terminal of the read transistor to transfer the charge of the electron or the hole collected at the third semiconductor region to the read voltage at a second current path node of the read transistor.

23. An image sensor comprising:
- a semiconductor region;
- a deep trench comprising an insulating material surrounding the semiconductor region;
- a first doped region disposed over the semiconductor region, the first doped region having a first doping type, the semiconductor region physically contacting the first doped region to form a p/n junction;
- a transfer gate comprising a shallow trench surrounding the first doped region, the shallow trench comprising a conductor surrounded by an insulator;
- a ring shaped well disposed over the first doped region and surrounding parts of the first doped region, the ring shaped well having a second doping type opposite to the first doping type, the ring shaped well defined by the deep trench and the shallow trench;
- a second doped region within the ring shaped well and disposed over the first doped region, the second doped region being more heavily doped than the first doped region and of the same doping type as the first doped region; and
- a third doped region disposed over the second doped region, the third doped region being more heavily doped than the second doped region and of the same doping type as the first doped region, wherein the first doped region, the second doped region, the third doped region, and the transfer gate forming a depletion mode transistor.

24. The sensor of claim 23, wherein the transfer gate is configured to be coupled to a voltage terminal for controlling transfer of charge carriers from the first doped region to the third doped region.

25. The sensor of claim 24, wherein the first doped region comprises a photosensitive region, and wherein the photosensitive region is configured to generate charge carriers in response to an exposure to light and to store the charge carriers.

* * * * *